United States Patent
Kim et al.

(10) Patent No.: US 10,547,017 B2
(45) Date of Patent: Jan. 28, 2020

(54) ORGANIC LIGHT EMITTING DIODE DISPLAY DEVICE AND METHOD OF FABRICATING THE SAME

(71) Applicant: LG Display Co., Ltd., Seoul (KR)

(72) Inventors: Young-Mi Kim, Incheon (KR); Jong-Geun Yoon, Gyeonggi-Do (KR); Joon-Young Heo, Seoul (KR); Han-Sun Park, Gyeonggi-Do (KR); Eui-Doo Do, Gyeonggi-Do (KR); Yeon-Kyeong Lee, Gyeonggi-Do (KR); Dae-Hyun Kim, Seoul (KR); Jong-Sik Shim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/287,312

(22) Filed: Feb. 27, 2019

(65) Prior Publication Data

US 2019/0198792 A1    Jun. 27, 2019

Related U.S. Application Data

(60) Continuation of application No. 15/948,615, filed on Apr. 9, 2018, now Pat. No. 10,256,428, which is a
(Continued)

(30) Foreign Application Priority Data

Sep. 22, 2011  (KR) ......................... 10-2011-0095959
Sep. 12, 2012  (KR) ......................... 10-2012-0101196

(51) Int. Cl.
*H01L 51/50*      (2006.01)
*H01L 27/32*      (2006.01)
(Continued)

(52) U.S. Cl.
CPC ...... *H01L 51/5012* (2013.01); *H01L 27/3211* (2013.01); *H01L 27/3218* (2013.01);
(Continued)

(58) Field of Classification Search
CPC ............. H01L 51/0016; H01L 27/3211; H01L 51/3234; H01L 51/5092; H01L 27/3218;
(Continued)

(56) References Cited

U.S. PATENT DOCUMENTS 5,294,869 A   3/1994 Tang et al.
5,294,870 A   3/1994 Tang et al.
(Continued)

FOREIGN PATENT DOCUMENTS

CN    1328704 A    12/2001
CN    1468041 A    1/2004
(Continued)

OTHER PUBLICATIONS

Chinese Office Action issued in Chinese Patent Application No. 201210357124.6 dated Jan. 7, 2015.
(Continued)

*Primary Examiner* — Thinh T Nguyen
(74) *Attorney, Agent, or Firm* — Morgan, Lewis & Bockius LLP

(57) ABSTRACT

In an organic light emitting diode (OLED) display device and a method for fabricating the same, OLED pixels are patterned through a photolithography process, so a large area patterning can be performed and a fine pitch can be obtained, and an organic compound layer can be protected by forming a buffer layer of a metal oxide on an upper portion of the organic compound layer or patterning the organic compound layer by using a cathode as a mask, improving device efficiency. In addition, among red, green, and blue pixels, two pixels are patterned through a lift-off process and the
(Continued)

other remaining one is deposited to be formed without patterning, the process can be simplified and efficiency can be increased.

6 Claims, 20 Drawing Sheets

Related U.S. Application Data division of application No. 15/215,339, filed on Jul. 20, 2016, now Pat. No. 9,960,376, which is a division of application No. 14/644,901, filed on Mar. 11, 2015, now Pat. No. 9,425,438, which is a division of application No. 13/624,166, filed on Sep. 21, 2012, now Pat. No. 9,006,009.

(51) Int. Cl.
| | | |
|---|---|---|
| *H01L 51/00* | (2006.01) | |
| *H01L 51/52* | (2006.01) | |
| *H01L 51/56* | (2006.01) | |
| *H01L 27/15* | (2006.01) | |
| *H01L 33/62* | (2010.01) | |
| *H01L 33/20* | (2010.01) | |

(52) U.S. Cl.
CPC ...... *H01L 51/0002* (2013.01); *H01L 51/0016* (2013.01); *H01L 51/0018* (2013.01); *H01L 51/5056* (2013.01); *H01L 51/5072* (2013.01); *H01L 51/5088* (2013.01); *H01L 51/5092* (2013.01); *H01L 51/5234* (2013.01); *H01L 51/56* (2013.01); *H01L 27/153* (2013.01); *H01L 33/20* (2013.01); *H01L 33/62* (2013.01)

(58) Field of Classification Search
CPC ............. H01L 51/5088; H01L 51/5002; H01L 51/5018; H01L 33/22
USPC ............... 438/34, 35, 42, 99; 257/40, 72, 88
See application file for complete search history.

(56) References Cited

U.S. PATENT DOCUMENTS

| | | |
|---|---|---|
| 5,693,962 A | 12/1997 | Shi et al. |
| 5,953,585 A | 9/1999 | Miyaguchi |
| 6,120,338 A | 9/2000 | Hirano et al. |
| 7,147,992 B2 | 12/2006 | Itou et al. |
| 7,534,557 B2 | 5/2009 | Tachikawa et al. |
| 7,947,518 B2 | 5/2011 | Tsai |
| 8,471,275 B2 | 6/2013 | Lee et al. |
| 8,664,017 B2 | 3/2014 | Fushimi et al. |
| 2002/0072139 A1 | 6/2002 | Kashiwabara |
| 2003/0160564 A1 | 8/2003 | Park et al. |
| 2005/0153058 A1 | 7/2005 | Tachikawa et al. |
| 2007/0114909 A1 | 5/2007 | Park et al. |
| 2008/0124824 A1 | 5/2008 | Tsai et al. |
| 2008/0129191 A1 | 6/2008 | Lee et al. |
| 2010/0140645 A1* | 6/2010 | Shibata et al. ...... H01L 51/5016 257/40 |

FOREIGN PATENT DOCUMENTS

| | | |
|---|---|---|
| CN | 1653855 A | 8/2005 |
| CN | 101257744 A | 9/2008 |
| CN | 102169959 A | 8/2011 |
| JP | 2002-0359074 A | 12/2002 |
| JP | 2008-085200 A | 4/2008 |
| JP | 2008-147072 A | 6/2008 |
| TW | 200826330 A | 6/2008 |
| WO | 2008-038588 A1 | 4/2008 |

OTHER PUBLICATIONS

KIPO: Office Action for Korean Patent Application No. KR 10-2012-0101196 dated Apr. 19, 2014.
Extended European Search Report issued in corresponding European Patent Application No. 12006623.8 dated Mar. 11, 2013.
English Translation of Japanese PCT WO 2008/03588 A1 (Apr. 2008) Naotoshi et al.

* cited by examiner

ORGANIC LIGHT EMITTING DIODE DISPLAY DEVICE AND METHOD OF FABRICATING THE SAME

CROSS REFERENCE TO RELATED APPLICATION

This application is a continuation of U.S. patent application Ser. No. 15/948,615, filed Apr. 9, 2018, which is a divisional of U.S. patent application Ser. No. 15/215,339, filed on Jul. 20, 2016 (now U.S. Pat. No. 9,960,376, issued on May 1, 2018), which is a divisional of U.S. patent application Ser. No. 14/644,901, filed on Mar. 11, 2015 (now U.S. Pat. No. 9,425,438, issued on Aug. 23, 2016), which is a divisional of U.S. patent application Ser. No. 13/624,166, filed on Sep. 21, 2012 (now U.S. Pat. No. 9,006,009, issued on Apr. 14, 2015), which claims the benefit of Korean Applications No. 10-2011-0095959, filed on Sep. 22, 2011, and No. 10-2012-0101196, filed on Sep. 12, 2012, all of which are hereby expressly incorporated by reference in their entireties.

FIELD OF THE INVENTION

The present invention relates to organic light emitting diode (OLED) display device and a method of fabricating the same and, more particularly, to an OLED display device in which OLED pixels are patterned through a photolithography process, and a method of fabricating the same.

DESCRIPTION OF THE RELATED ART

Recently, as interest in information displays has been on the rise and demand for the use of portable information media has been increased, lightweight flat panel displays (FPDs) substituting cathode ray tubes (CRTs) as existing display devices have been actively researched and commercialized.

In the FPD fields, a liquid crystal display (LCD) device, which is lighter and consumes less power, has been spotlighted; however, since an LCD device is a light receiving device, rather than a light emitting device, having shortcomings of brightness, contrast ratio, and a viewing angle, and the like, so a development of a new display device that may overcome such drawbacks has been actively made.

An LED display device, one of new display devices, is a self-luminous type device, which thus is excellent in a viewing angle and contrast ratio, is lighter and thinner because it does not need a backlight, and is advantageous in terms of power consumption, relative to an LCD device. In addition, an OLED display device can be driven by a DC and at a low voltage, has a fast response speed, and is especially advantageous in terms of fabrication costs.

Unlike an LCD device or a plasma display panel (PDP), deposition and encapsulation are the whole of a fabrication process of an OLED display device, so the fabrication process is very simple. Also, when the OLED display device is driven according to an active matrix scheme in which each pixel has a thin film transistor (TFT) as a switching element, the same luminance can be obtained although a low current is applied, so, advantageously, the OLED display device consumes low power, has a high pitch (or high definition or high resolution), and can be increased in size.

Hereinafter, a basic structure and operational characteristics of an OLED display device will be described in detail with reference to the accompanying drawings.

FIG. 1 is a diagram illustrating a light emission principle of a general OLED display device.

As shown in FIG. 1, a general OLED display device includes an OLED. The OLED includes organic compound layers 301, 30b, 30c, 30d, and 30e formed between an anode 18 as a pixel electrode and a cathode 28 as a common electrode.

Here, the organic compound layers 30a, 30b, 30c, 30d, and 30e include a hole injection layer 30a, a hole transport layer 30b, an emission layer 30c, an electron transport layer 30d, and an electron injection layer 30e.

When a driving voltage is applied to the anode 18 and the cathode 28, holes which have passed through the hole transport layer 30b and electrons which have passed through the electron transport layer 30e move to the light emission layer 30c to form excitons, and as a result, the light emission layer 30c emits visible light.

In the OLED display device, the pixels each having the OLED having the foregoing structure are arranged in a matrix form and selectively controlled by a data voltage and a scan voltage to display an image.

The OLED display device is divided into a passive matrix type OLED display device and an active matrix type display device using TFTs as switching elements. Among them, in the active matrix type OLED display device, TFTs as active elements are selectively turned on to select pixels and emitting of pixels is maintained by a voltage maintained in a storage capacitor.

FIG. 2 is an equivalent circuit diagram of a pixel in a general OLED display device. Namely, FIG. 2 illustrates an example of an equivalent circuit diagram of a pixel having a general 2T1C (including two transistors and one capacitor) in an active matrix type OLED display device.

Referring to FIG. 2, a pixel of an active matrix type OLED display device includes an OLED, a data line DL and a gate line GL crossing each other, a switching TFT SW, a driving TFT DR, and a storage capacitor Cst.

Here, the switching TFT SW is turned on in response to a scan pulse from the gate line GL to conduct a current path between a source electrode and a drain electrode thereof. During an ON-time period of the switching TFT SW, a data voltage from the data line DL is applied to a gate electrode of the driving TFT DR and the storage capacitor Cst by way of the source electrode and drain electrode of the switching TFT SW.

Here, the driving TFT DR controls a current flowing in the OLED according to the data voltage applied to the gate electrode thereof. The storage capacitor Cst stores a voltage between the data voltage and a low potential power source voltage VSS and uniformly maintains it during one frame period.

In order to form the several organic compound layers constituting the OLED display device, a vacuum evaporation method is largely used.

Here, in order to use the vacuum evaporation method, a mask (or a shadow mask) or a fine metal mask (FMM) having a plurality of openings corresponding to a plurality of pixel regions is used. However, this method has a limitation in that it is not easy to cope with a fine pitch of patterns for increasing a size of a substrate and implementing a high resolution display Namely, FMM is fabricated by forming holes as a pattern intended for deposition on a thin metal plate and stretching the same. Thus, there is a limitation in forming a pattern having a small size, making it difficult to reduce the size of an OLED. Also, when a fine metal mask is increased in size in order to increase a size of a panel, warpage occurs due to the characteristics of the fine metal mask, distort the pattern to degrade a production yield.

SUMMARY OF THE INVENTION

An aspect of the present invention provides an organic light emitting diode (OLED) display device in which OLED pixels are patterned through a photolithography process, thus being available for large area patterning and obtaining a high pitch (or high definition or high resolution), and a method for fabricating the same.

Another aspect of the present invention provides an OLED display device in which a light emitting layer is protected during a patterning process through photolithography, and a method for fabricating the same.

Another aspect of the present invention provides an OLED display device capable of simplifying a process and increasing efficiency, and a method for fabricating the same.

According to an aspect of the present invention, there is provided an organic light emitting diode (OLED) display device including: a first electrode formed on a substrate; a hole injection layer and a hole transport layer formed on the substrate with the first electrode formed thereon; a first light emitting layer formed of a first organic film on the substrate with the hole injection layer and the hole transport layer formed thereon; a second light emitting layer formed of a second organic film on the substrate with the first light emitting layer formed thereon; a third light emitting layer formed by depositing a third organic film on the entire surface of the substrate with the first light emitting layer and the second light emitting layer formed thereon; and an electron injection layer and a second electrode formed on the third light emitting layer.

The third light emitting layer may be formed on upper portions of the first light emitting layer and the second light emitting layer as well as between the first light emitting layer and the second light emitting layer.

According to another aspect of the present invention, there is provided an organic light emitting diode (OLED) display device including: a first electrode formed on a substrate; a first hole injection layer, a first hole transport layer, a first light emitting layer, a first electron transport layer, and a first buffer layer laminated on the substrate; a second hole injection layer, a second hole transport layer, a second light emitting layer, a second electron transport layer, and a second buffer layer laminated on the substrate; a third hole injection layer, a third hole transport layer, a third light emitting layer, a third electron transport layer, and a third buffer layer laminated on the substrate; and a second electrode formed on the first, second, and third buffer layers, wherein the first, second, and third buffer layers are made of a metal oxide.

The first, second, and third buffer layers may be made of a 1-2 Group and 12-16 Group metal oxide or 3-12 Group transition metal oxide.

According to another aspect of the present invention, there is provided a method for fabricating an organic light emitting diode (OLED) display device, including: forming a first electrode on a substrate; forming a first light emitting layer formed of a first organic film on the substrate through a first photo process; forming a second light emitting layer formed of a second organic film on the substrate through a second photo process; depositing a third organic film on first and second photosensitive resin patterns remaining after being used during the first and second photo processes; removing the third organic film deposited on upper portions of the first and second photosensitive resin patterns together with the first and second photosensitive resin patterns through a lift-off process to form a third light emitting layer; and forming a second electrode on the first, second, and third light emitting layers.

According to another aspect of the present invention, there is provided a method for fabricating an organic light emitting diode (OLED) display device, including: (a) forming a first electrode on a substrate; (b) applying a photosensitive resin to the entire surface of the substrate to form a first photosensitive resin layer; (c) selectively exposing and developing the first photosensitive resin layer to form a first photosensitive resin pattern made of the photosensitive resin at a position other than a position where a first light emitting layer is to be formed; (d) depositing a first organic film on the first photosensitive resin pattern in a state in which the first photosensitive resin pattern remains; (e) removing the first organic film deposited on an upper portion of the first photosensitive resin pattern together with the first photosensitive resin pattern through a lift-off process to form a first light emitting layer formed of the first organic film on the substrate; (f) forming a second light emitting layer formed of a second organic film on the substrate through the same processes as (b) to (e); (g) depositing a third organic film on the entire surface of the substrate with the first light emitting layer and the second light emitting layer formed thereon; and (h) forming a second electrode on the substrate.

The third light emitting layer may be formed between the first light emitting layer and the second light emitting layer.

The third light emitting layer may be formed on upper portions of the first light emitting layer and the second light emitting layer as well as between the first light emitting layer and the second light emitting layer.

After a hole injection layer and a hole transport layer are formed on the substrate with the first electrode formed thereon, the first light emitting layer may be formed thereon.

The first light emitting layer may be formed as any one of red, green, and blue light emitting layers.

The second light emitting layer may be formed as another one of the red, green, and blue light emitting layers.

The third light emitting layer may be formed as the other remaining one of the red, green, and blue light emitting layers.

After an electron transport layer and an electron injection layer are formed on the substrate with the first, second, and third light emitting layers formed thereon, the second electrode may be formed thereon.

According to another aspect of the present invention, there is provided a method for fabricating an organic light emitting diode (OLED) display device, including: forming a first electrode on a substrate; forming a first hole injection layer, a first hole transport layer, a first light emitting layer, a first electron transport layer, and a first buffer layer in a laminated manner on the substrate through a first photo process; forming a second hole injection layer, a second hole transport layer, a second light emitting layer, a second electron transport layer, and a second buffer layer in a laminated manner on the substrate through a first photo process; forming a third hole injection layer, a third hole transport layer, a third light emitting layer, a third electron transport layer, and a third buffer layer in a laminated manner on the substrate through a first photo process; and forming a second electrode on the first, second, and third buffer layers, wherein the first, second, and third buffer layers are made of a metal oxide.

According to another aspect of the present invention, there is provided a method for fabricating an organic light emitting diode (OLED) display device, including: (a) forming a first electrode on a substrate; (b) applying a photosensitive resin to the entire surface of the substrate to form a first photosensitive resin layer; (c) selectively exposing and developing the first photosensitive resin layer to form a first photosensitive resin pattern made of the photosensitive resin at a position other than a position where a first light emitting layer is to be formed; (d) depositing a thin film for a first hole injection layer, a thin film for a first hole transport layer, a first organic film, a thin film for a first electron transport layer, and a thin film for a first buffer layer in a state in which the first photosensitive resin pattern remains; (e) removing the thin film for a first hole injection layer, the thin film for a first hole transport layer, the first organic film, the thin film for a first electron transport layer, and the thin film for a first buffer layer deposited on an upper portion of the first photosensitive resin pattern together with the first photosensitive resin pattern through a lift-off process to form a first hole injection layer, a first hole transport layer, a first light emitting layer, a first electron transport layer, and a first buffer layer, which are formed of thin film for a first hole injection layer, the thin film for a first hole transport layer, the first organic film, the thin film for a first electron transport layer, and the thin film for a first buffer layer, respectively, on the substrate; (f) forming a second hole injection layer, a second hole transport layer, a second light emitting layer, a second electron transport layer, and a second buffer layer through the same processes as (b) to (e); (g) forming a third hole injection layer, a third hole transport layer, a third light emitting layer, a third electron transport layer, and a third buffer layer through the same processes as (b) to (e); and (h) forming a second electrode on the first, second, and third buffer layers, wherein the first, second, and third buffer layers are made of a metal oxide.

The forming of the first hole injection layer, the first hole transport layer, the first light emitting layer, the first electron transport layer, and the first buffer layer may include: depositing a thin film for a first hole injection layer, a thin film for a first hole transport layer, a first organic film, a thin film for a first electron transport layer, and a thin film for a first buffer layer on the substrate; applying a photosensitive resin to the entire surface of the substrate with the thin film for a first hole injection layer, the thin film for a first hole transport layer, the first organic film, the thin film for a first electron transport layer, and the thin film for a first buffer layer deposited thereon to form a first photosensitive resin layer; exposing and developing the first photosensitive resin layer to from a first photosensitive resin pattern made of the photosensitive resin at a position where a first light emitting is to be formed; and selectively etching the thin film for a first hole injection layer, the thin film for a first hole transport layer, the first organic film, the thin film for a first electron transport layer, and the thin film for a first buffer layer by using the first photosensitive resin pattern as a mask to form the first hole injection layer, the first hole transport layer, the first light emitting layer, the first electron transport layer, and the first buffer layer, which are formed of thin film for a first hole injection layer, the thin film for a first hole transport layer, the first organic film, the thin film for a first electron transport layer, and the thin film for a first buffer layer, respectively, on the substrate.

The forming of the second hole injection layer, the second hole transport layer, the second light emitting layer, the second electron transport layer, and the second buffer layer may include: depositing a thin film for a second hole injection layer, a thin film for a second hole transport layer, a second organic film, a thin film for a second electron transport layer, and a thin film for a second buffer layer on the substrate; applying a photosensitive resin to the entire surface of the substrate with the thin film for a second hole injection layer, the thin film for a second hole transport layer, the second organic film, the thin film for a second electron transport layer, and the thin film for a second buffer layer deposited thereon to form a second photosensitive resin layer; exposing and developing the second photosensitive resin layer to from a second photosensitive resin pattern made of the photosensitive resin at a position where a second light emitting is to be formed; and selectively etching the thin film for a second hole injection layer, the thin film for a second hole transport layer, the second organic film, the thin film for a second electron transport layer, and the thin film for a second buffer layer by using the second photosensitive resin pattern as a mask to form the second hole injection layer, the second hole transport layer, the second light emitting layer, the second electron transport layer, and the second buffer layer, which are formed of thin film for a second hole injection layer, the thin film for a second hole transport layer, the second organic film, the thin film for a second electron transport layer, and the thin film for a second buffer layer, respectively, on the substrate.

The forming of the third hole injection layer, the third hole transport layer, the third light emitting layer, the third electron transport layer, and the third buffer layer may include: depositing a thin film for a third hole injection layer, a thin film for a third hole transport layer, a third organic film, a thin film for a third electron transport layer, and a thin film for a third buffer layer on the substrate; applying a photosensitive resin to the entire surface of the substrate with the thin film for a third hole injection layer, the thin film for a third hole transport layer, the third organic film, the thin film for a third electron transport layer, and the thin film for a third buffer layer deposited thereon to form a third photosensitive resin layer; exposing and developing the third photosensitive resin layer to from a third photosensitive resin pattern made of the photosensitive resin at a position where a third light emitting is to be formed; and selectively etching the thin film for a third hole injection layer, the thin film for a third hole transport layer, the third organic film, the thin film for a third electron transport layer, and the thin film for a third buffer layer by using the third photosensitive resin pattern as a mask to form the third hole injection layer, the third hole transport layer, the third light emitting layer, the third electron transport layer, and the third buffer layer, which are formed of thin film for a third hole injection layer, the thin film for a third hole transport layer, the third organic film, the thin film for a third electron transport layer, and the thin film for a third buffer layer, respectively, on the substrate.

The first, second, and third buffer layers may be made of a 1-2 Group and 12-16 Group metal oxide or 3-12 Group transition metal oxide.

According to another aspect of the present invention, there is provided a method for fabricating an organic light emitting diode (OLED) display device, including: (a) forming a fourth electrode on a substrate; (b) forming a first organic film and a first conductive film on the substrate with the fourth electrode formed thereon; (c) applying a photosensitive resin to the entire surface of the substrate with the first conductive film formed thereon to form a first photosensitive resin layer; (d) selectively exposing and developing the first photosensitive resin layer to form a first photosensitive resin pattern made of the photosensitive resin at a position at which a first light emitting is to be formed; (e) selectively removing the first conductive film by using the first photosensitive resin pattern as a mask to form a first electrode; (f) removing the first photosensitive resin pattern and selectively removing the underlying exposed first organic film by using the first electrode as a mask to form a first light emitting layer formed of the first organic film; (g) forming a second light emitting layer and a second electrode on the substrate through the same processes as (b) to (f); and (h) forming a third light emitting layer and a third electrode on the substrate through the same processes as (b) to (f).

After a thin film for a first hole injection layer and a thin film for a first hole transport layer are formed on the substrate with the fourth electrode formed thereon, the first organic film may be formed, and after a thin film for a first electron transport layer is formed, the first conductive film may be formed.

As described above, in the case of the OLED display device and the method for fabricating the same according to embodiments of the present invention, since OLED pixels are patterned through a photolithography process, a large area patterning can be performed and a fine pitch can be obtained, and an organic compound layer can be protected by forming a buffer layer of a metal oxide on an upper portion of the organic compound layer or patterning the organic compound layer by using a cathode as a mask, improving device efficiency. Here, patterning through a photolithography process can be performed through a solution process, and since a light emitting layer is protected during a patterning process, a driving voltage and power consumption of the device can be reduced and efficiency can be enhanced.

Also, in the case of the OLED display device and the method for fabricating the same according to embodiments of the present invention, among red, green, and blue pixels, two pixels are patterned through a lift-off process and the other remaining one is deposited to be formed without patterning, the process can be simplified and efficiency can be increased.

The foregoing and other objects, features, aspects and advantages of the present invention will become more apparent from the following detailed description of the present invention when taken in conjunction with the accompanying drawings.

DETAILED DESCRIPTION OF THE INVENTION

Hereinafter, an organic light emitting diode (OLED) display device and a method for fabricating the same according to embodiments of the present invention will be described in detail with reference to the accompanying drawings such that they can be easily implemented by a person skilled in the art to which the present invention pertains. The present invention may be implemented in various forms without being limited to the embodiments described herein. Patterning of a large area with respect to an organic compound layer of an OLED display device cannot be handled by an existing method using a fine metal mask due to sagging of a substrate and a mask, so various large area patterning methods have been researched. Among them, the present invention proposes a patterning method through a photolithography process (referred to as a 'photo process', hereinafter), and here, the photo process is advantageous in that it is available for large area patterning and obtaining a fine pitch, and available for an application of a solution process.

FIGS. 3A through 3L are sequential sectional views illustrating a method for fabricating an OLED display device according to a first embodiment of the present invention, in which a method for fabricating an OLED diode with respect to some pixels is taken as an example.

Here, a method for fabricating an OLED with respect to a pixel including 2T1C (two transistors and one capacitor) is taken as an example for the description purpose, but the present invention is not limited thereto.

First, although not shown, in an OLED display device according to a first embodiment of the present invention, a gate line including a first gate electrode and a storage electrode including a second gate electrode may be formed on a substrate 110 made of an insulating material such as transparent glass, plastic, or the like.

A gate insulating layer made of silicon nitride (SiNx), silicon oxide ($SiO_2$), or the like, may be formed on the gate line including the first gate electrode and the storage electrode including the second electrode.

A first active layer and a second active layer, made of semiconductor, may be formed on the gate insulating layer. The first active layer and the second active layer may be positioned on the first gate electrode and the second gate electrode, respectively.

A data line, a driving voltage line, a first source/drain electrode, and a second source/drain electrode may be formed on an upper portion of the first active layer and the second active layer.

A predetermined passivation layer may be formed on the substrate 110 on which the data line, the driving voltage line, the first source/drain electrode, and the second source/drain electrode have been formed.

Figure 1:
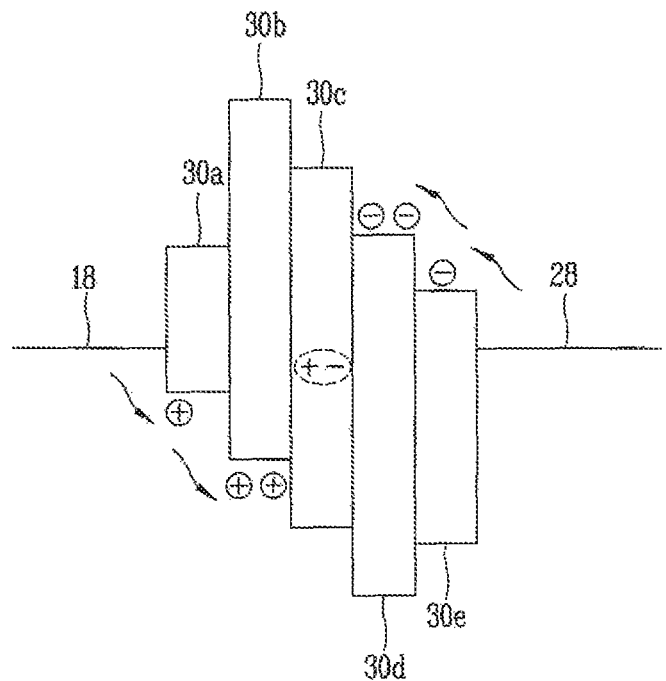
FIG. 1 is a diagram illustrating a light emission principle of a general organic light emitting diode (OLED) display device.
Figure 2:
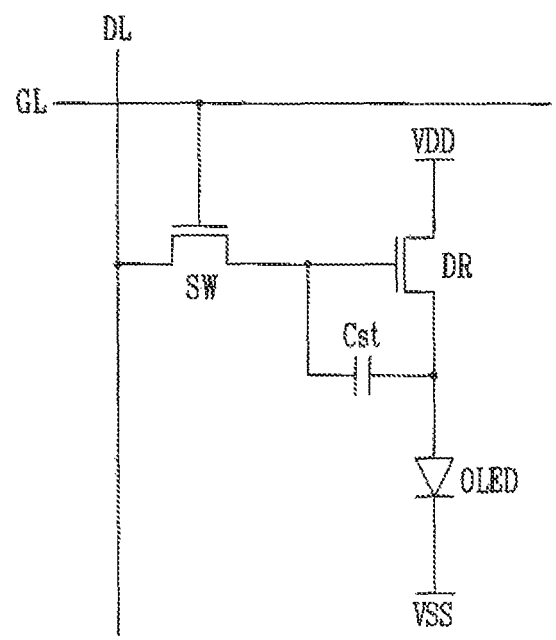
FIG. 2 is an equivalent circuit diagram of a pixel in a general OLED display device.
Figure 3A:
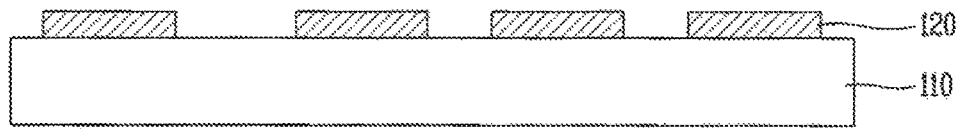
FIGS. 3A through 3L are sequential sectional views illustrating a method for fabricating an OLED display device according to a first embodiment of the present invention.

As shown in FIG. 3A, a pixel electrode 120 and a connecting electrode (not shown) may be formed on the substrate 110 with the passivation film formed thereon. The pixel electrode 120 and the connecting electrode may be made of a transparent conductive material such as indium tin oxide (ITO) or a reflective conductive material such as aluminum, silver, or an alloy thereof.

The pixel electrode 120 as an anode may be electrically connected to the second drain electrode through a second contact hole, and the connecting electrode may electrically connect the first drain electrode and the second gate electrode through a first contact hole and a third contact hole.

A partition (not shown) may be formed on the substrate 110 with the pixel electrode 120 formed thereon. Here, the partition may encompass the edges of the pixel electrode 120, like a bank, to define an opening, and may be made of an organic insulating material or an inorganic insulating material.

An organic compound layer may be formed on the substrate 110.

Here, the organic compound layer may have a multilayer structure including an auxiliary layer in order to enhance luminous efficiency of a light emitting layer that emits light, besides the light emitting layer. The auxiliary layer may include an electron transport layer and a hole transport layer for balancing electrons and holes and an electron injection layer and a hole injection layer for strengthening injection of electrons and holes.

Figure 3B:

The organic compound layer may be formed through a photo process and a lift-off process, and to this end, as shown in FIG. 3B, a first organic film 151 is deposited on the substrate 110.

Here, the first organic film 151 may be deposited after the hole injection layer and the hole transport layer are formed on the substrate 110, and here, the first organic film 151 may be deposited to form a red, green, or blue light emitting layer.

The hole injection layer may facilitate injection of holes from the pixel electrode 120, and the hole transport layer serves to allow holes to be transported to the light emitting layer.

Figure 3C:
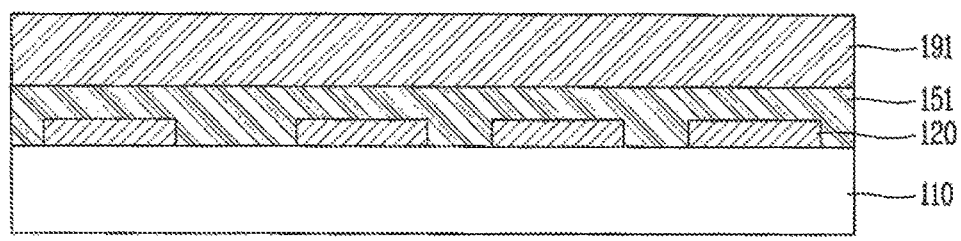

Thereafter, as shown in FIG. 3C, a photosensitive resin (or photoresist) is coated on the entire surface of the substrate 110 with the first organic film 151 deposited thereon, to form a first photosensitive resin layer 191.

Ultraviolet rays are selectively irradiated (exposure) to the first photosensitive resin layer 191 through a certain mask (not shown).

Figure 3D:
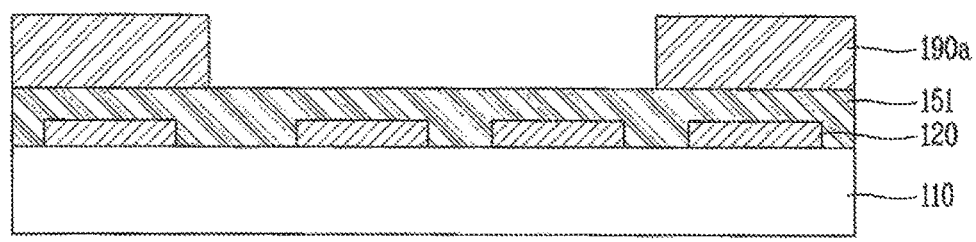

Thereafter, when the first photosensitive resin layer 191 exposed through the mask is developed, a first photosensitive resin pattern 190a made of the photosensitive resin remains only at a position where a first light emitting layer is to be formed as shown in FIG. 3D.

A photosensitive resin developing solution is used for the developing operation, and here, any developing solution may be used as long as it does not dissolve a material of the light emitting layer. For example, a generally used organic alkali-based developing solution may be used, or an inorganic alkali-based developing solution or an aqueous solution capable of developing resist may be used.

Figure 3E:
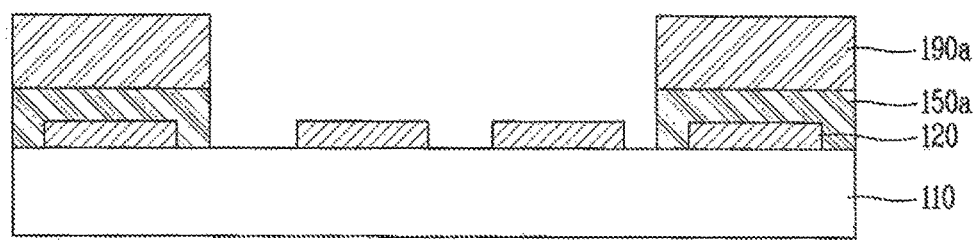

Thereafter, as shown in FIG. 3E, a partial region of the first organic film formed under the first photosensitive resin pattern 190a is selectively etched by using the first photosensitive resin pattern 190a as a mask, to form a first light emitting layer 150a formed of the first organic film on the substrate 110 (first photo process).

Here, for example, the first light emitting layer 150a may be a red light emitting layer, and the etching may include wet etching as well as dry etching. However, the present invention is not limited thereto and the first light emitting layer 150a may be a red or blue light emitting layer.

Figure 3F:
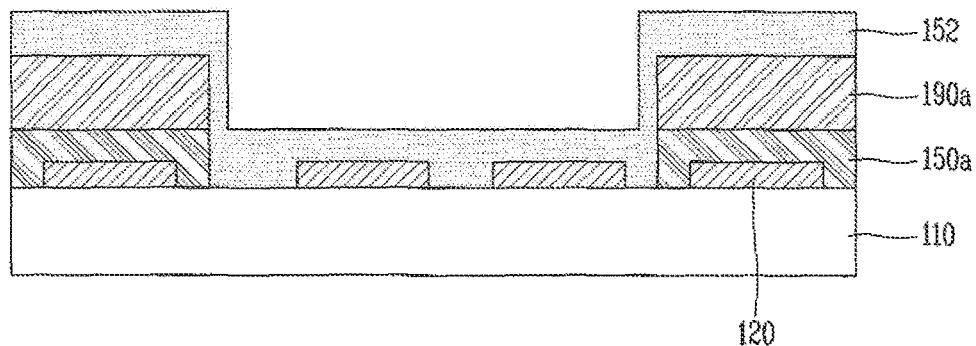

Thereafter, as shown in FIG. 3F, with the first photosensitive resin pattern 190a remaining, a second organic film 152 is deposited thereon.

Figure 3G:
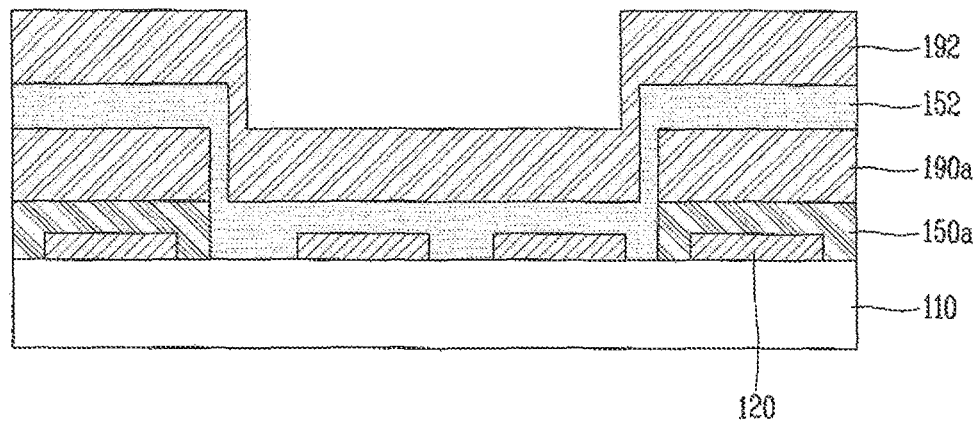

A follow-up process is substantially the same as the first photo process for forming the first light emitting layer 150a. Namely, as shown in FIG. 3G, a photosensitive resin is coated on the entire surface of the substrate 110 with the second organic film 152 formed thereon, to form a second photosensitive resin layer 192.

Thereafter, UV rays are selectively irradiated to the second photosensitive resin layer 192 through a certain mask (not shown).

Figure 3H:
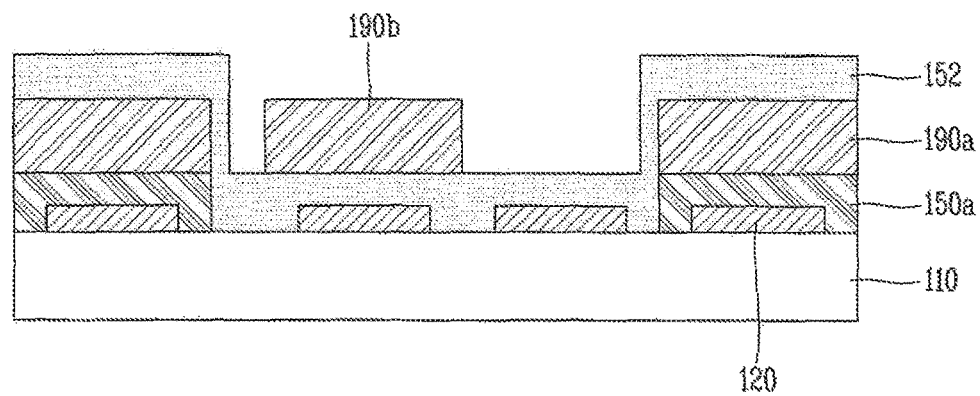

Thereafter, when the second photosensitive resin layer 192 exposed through the mask is developed, a second photosensitive resin pattern 190b made of the photosensitive resin remains only at a position where a second light emitting layer is to be formed as shown in FIG. 3H.

Figure 3I:
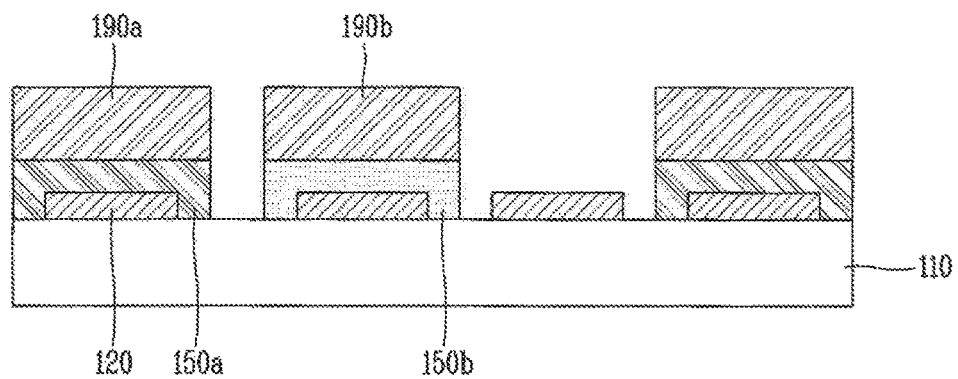

Thereafter, as shown in FIG. 3I, a partial region of the first organic film formed under the second photosensitive resin pattern 190b is selectively etched by using the second photosensitive resin pattern 190b as a mask, to form a second light emitting layer 150b formed of the second organic film on the substrate 110 (second photo process).

Here, for example, the second emitting layer 150b may be a green light emitting layer, and the etching may include wet etching as well as dry etching. However, the present invention is not limited thereto and when the first light emitting layer 150a is a red light emitting layer, the second light emitting layer 150b may be a blue light emitting layer, other than a green light emitting layer.

Figure 3J:
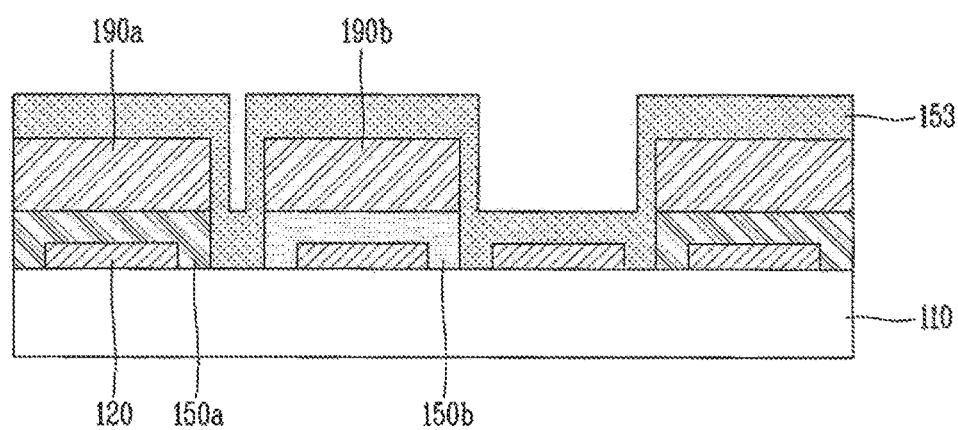

Thereafter, as shown in FIG. 3J, with the first photosensitive resin pattern 190a and the second photosensitive resin pattern 190b remaining, a third organic film 153 is deposited thereon.

Figure 3K:
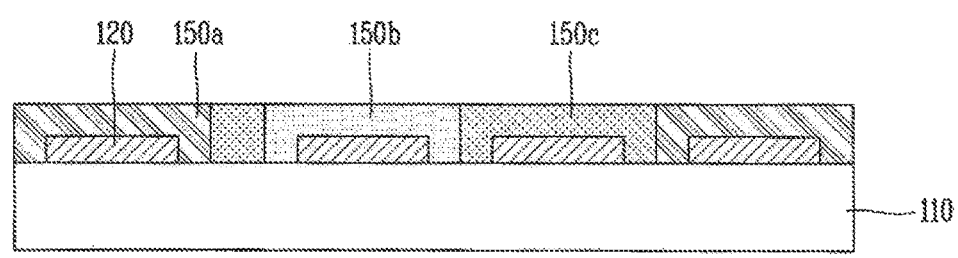

As a follow-up process, a lift-off process, rather than a photo process such as the first and second photo processes as described above, is used. Namely, as shown in FIG. 3K, the first photosensitive resin pattern and the second photosensitive resin pattern are removed through a lift-off process, and here, the third organic film remaining on upper portions of the first light emitting layer 150a and the second light emitting layer 150b is removed along with the first photosensitive resin pattern and the second photosensitive resin pattern.

As a result, a third light emitting layer 150c formed of the third organic film is formed between the first light emitting layer 150a and the second light emitting layer 150b.

Here, for example, when the first light emitting layer 150a is a red light emitting layer and the second light emitting layer 150b is a green light emitting layer, the third light emitting layer 150c may be a blue light emitting layer. Also, when the first light emitting layer 150a is a red light emitting layer and the second light emitting layer 150b is a blue light emitting layer, the third light emitting layer 150c may be a green light emitting layer. However, the present invention is not limited thereto and the first light emitting layer 150a, the second light emitting layer 150b, and the third light emitting layer 150c may be configured as red, green, and blue light emitting layers irrespective of order.

Figure 3L:
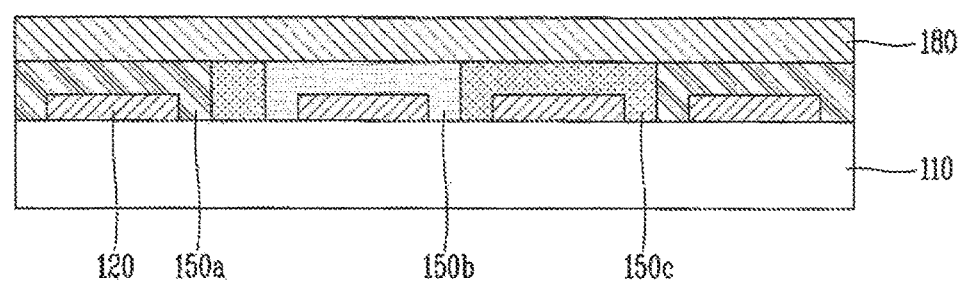

Thereafter, as shown in FIG. 3L, a common electrode 180 as a cathode may be formed on the first light emitting layer 150a, the second light emitting layer 150b, and the third light emitting layer 150c. Here, the common electrode, which receives a common voltage, may be made of a reflective conductive material including calcium (Ca), barium (Ba), magnesium (Mg), aluminum (Al), silver (Ag), or the like, or a transparent conductive material such as ITO, IZO, or the like.

Here, the foregoing common electrode 180 may be formed after the electron transport layer and the electron injection layer are formed on the substrate 110.

The electron injection layer facilitates injection of electrons from the common electrode 180, and the electron transport layer serves to allow electrons to move to the light emitting layers 150a, 150b, and 150c.

In this manner, in the case of the first embodiment of the present invention, since a single photo process, namely, a single photosensitive resin coating, exposing, developing, and etching process (a total of four processes) may be omitted, and thus, the process can be simplified. Also, since OLED pixels are patterned through the photo process, large patterning can be performed and high pitch can be obtained, and in addition, a solution process can be performed.

In the OLED display device configured as described above, the first gate electrode connected to the gate line and the first source electrode and the first drain electrode connected to the data line may constitute a first switching thin film transistor (TFT) along with the first active layer. Also, the second gate electrode connected to the first drain electrode, the second source electrode connected to the driving voltage line, and the second drain electrode connected to the pixel electrode 120 may constitute a driving TFT along with the second active layer.

Also, the pixel electrode 120, the light emitting layers 150a, 150b, and 150c, and the common electrode 180 may constitute an OLED, and the mutually overlapping storage electrode and driving voltage line may constitute a storage capacitor.

However, as mentioned above, when the organic compound layer is patterned through the photo process, the organic compound layer may be likely to be damaged by a photosensitive resin, a developing solution, and a strip solution, which may result in a degradation of efficiency and a life span.

Thus, in case of second and third embodiments of the present invention, a buffer layer made of metal oxide is formed on an upper portion of the organic compound layer to protect the organic compound layer against a photo process. This will be described in detail with reference to the accompanying drawings.

FIGS. 4A through 4H are sequential sectional views illustrating a method for fabricating an OLED display device according to a second embodiment of the present invention, in which a method for fabricating an OLED diode with respect to some pixels is taken as an example.

Although not shown, as mentioned above, in an OLED display device according to a second embodiment of the present invention, a gate line including a first gate electrode and a storage electrode including a second gate electrode may be formed on a substrate 210 made of an insulating material such as transparent glass, plastic, or the like.

A gate insulating layer made of silicon nitride (SiNx), silicon oxide ($SiO_2$), or the like, may be formed on the gate line including the first gate electrode and the storage electrode including the second electrode.

A first active layer and a second active layer, made of semiconductor, may be formed on the gate insulating layer. The first active layer and the second active layer may be positioned on the first gate electrode and the second gate electrode, respectively.

A data line, a driving voltage line, a first source/drain electrode, and a second source/drain electrode may be formed on an upper portion of the first active layer and the second active layer.

A predetermined passivation layer may be formed on the substrate 210 on which the data line, the driving voltage line, the first source/drain electrode, and the second source/drain electrode have been formed.

Figure 4A:
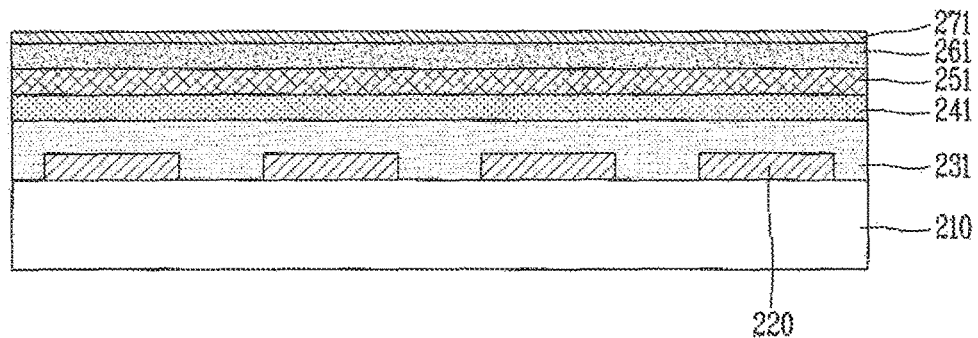
FIGS. 4A through 4H are sequential sectional views illustrating a method for fabricating an OLED display device according to a second embodiment of the present invention.

As shown in FIG. 4A, a pixel electrode 220 and a connecting electrode (not shown) may be formed on the substrate 210 with the passivation film formed thereon. The pixel electrode 220 and the connecting electrode may be made of a transparent conductive material such as indium tin oxide (ITO) or a reflective conductive material such as aluminum, silver, or an alloy thereof.

The pixel electrode 220 as an anode may be electrically connected to the second drain electrode through a second contact hole, and the connecting electrode may electrically connect the first drain electrode and the second gate electrode through a first contact hole and a third contact hole.

A partition (not shown) may be formed on the substrate 210 with the pixel electrode 220 formed thereon. Here, the partition may encompass the edges of the pixel electrode 220, like a bank, to define an opening, and may be made of an organic insulating material or an inorganic insulating material.

An organic compound layer may be formed on the substrate 210.

Here, the organic compound layer may have a multilayer structure including an auxiliary layer in order to enhance luminous efficiency of a light emitting layer that emits light, besides the light emitting layer. The auxiliary layer may include an electron transport layer and a hole transport layer for balancing electrons and holes and an electron injection layer and a hole injection layer for strengthening injection of electrons and holes.

Namely, as shown in FIG. 4A, a thin film 231 for a first hole injection layer, a thin film 241 for a first hole transport layer, a first organic film 251, a thin film 261 for a first electron transport layer, and a thin film 271 for a first buffer layer are sequentially deposited on the substrate 210 with the pixel electrode 220 formed thereon.

Here, the thin film 261 for a first electron transport layer may include a thin film for a first electron injection layer, and the thin film 271 for a first buffer layer may be made of a 1-2 Group and 12-16 Group metal oxide or 3-12 Group transition metal oxide.

Figure 4B:
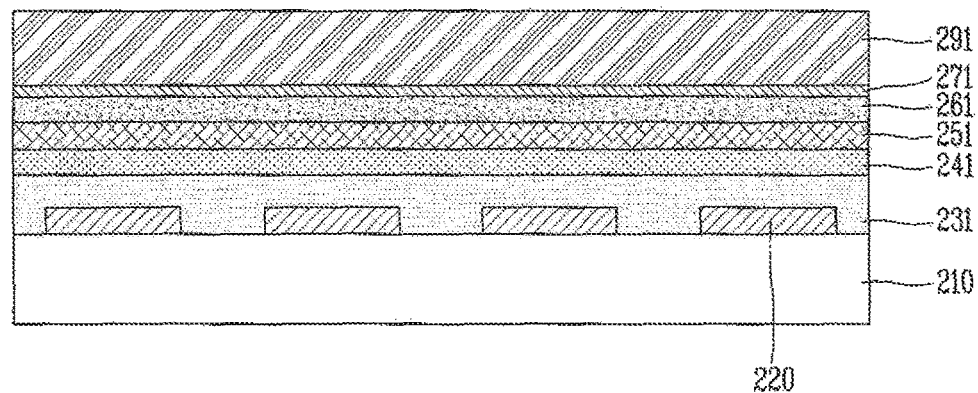

Thereafter, as shown in FIG. 4B, a photosensitive resin is coated on the entire surface of the substrate 210 on which the thin film 231 for a first hole injection layer, the thin film 241 for a first hole transport layer, the first organic film 251, the thin film 261 for a first electron transport layer, and the thin film 271 for a first buffer layer are deposited, in order to form a first photosensitive resin layer 291.

UV light is selectively irradiated to the first photosensitive resin layer 291 through a certain mask (not shown).

Figure 4C:
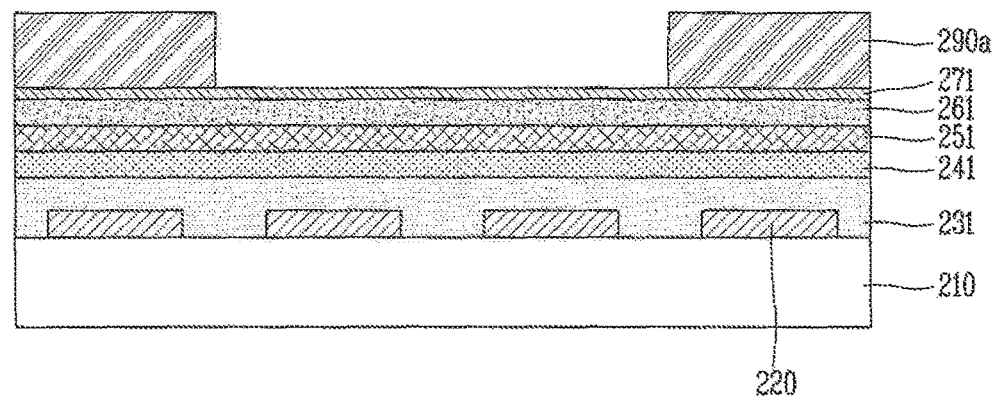

Thereafter, when the first photosensitive resin layer 291 exposed through the mask is developed, a first photosensitive resin pattern 290a made of the photosensitive resin remains only at a position where a first light emitting layer is to be formed as shown in FIG. 4C.

Figure 4D:
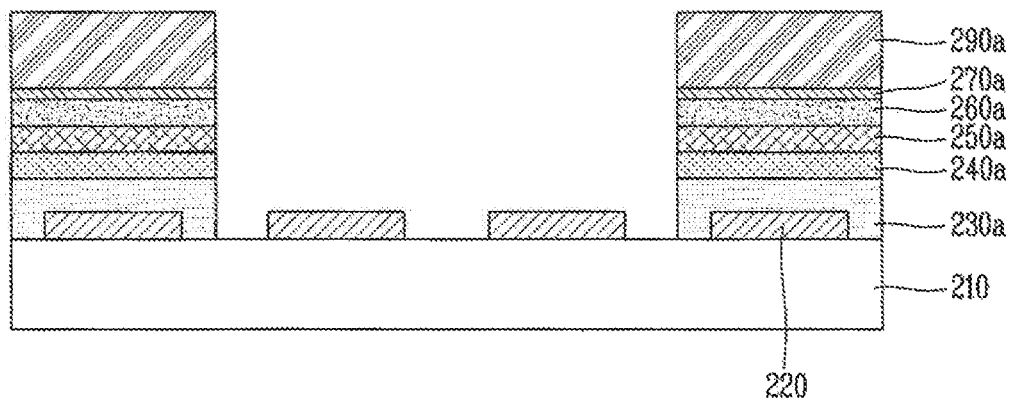

Thereafter, as shown in FIG. 4D, partial regions of the thin film for a first hole injection layer, the thin film for a first hole transport layer, the first organic film, the thin film for a first electron transport layer, and the thin film for a first buffer layer formed under the first photosensitive resin pattern 290a are selectively etched by using the first photosensitive resin pattern 290a as a mask, in order to form a first hole injection layer 230a, a first hole transport layer 240a, a first light emitting layer 250a, a first electron transport layer 260a, and a first buffer layer 270a formed of the thin film for a first hole injection layer, the thin film for a first hole transport layer, the first organic film, the thin film for a first electron transport layer, and the thin film for a first buffer layer, respectively, on the substrate 210 (first photo process).

In this manner, since the first buffer layer 270a is positioned on the upper portion of the organic compound layer, namely, on the first electron transport layer 260a, the organic compound layer, in particular, the first electron transport layer 260a, is prevented from being degraded, thus preventing a degradation of the device.

Also, since the first buffer layer 270a of metal oxide is applied, an energy barrier between the first electron transport layer 260a and the common electrode can be lowered, enhancing efficiency and a life span.

Here, for example, the first light emitting layer 250a may be a red light emitting layer, and the etching may include wet etching, as well as dry etching. However, the present invention is not limited thereto and the first light emitting layer 250a may be a green or blue light emitting layer.

Figure 4E:
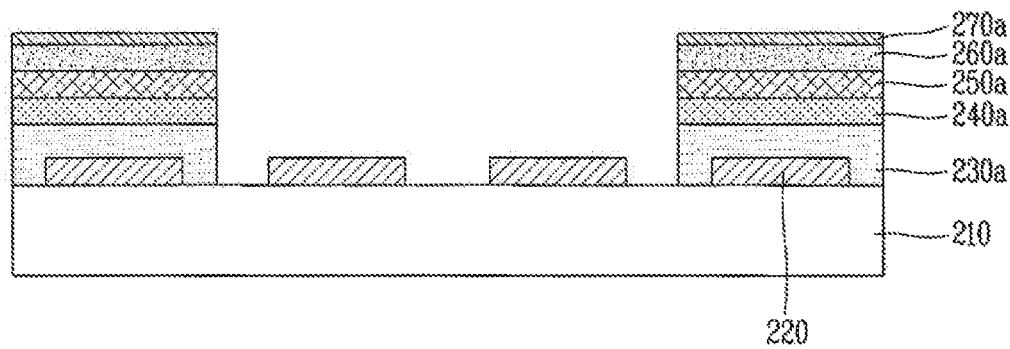

Thereafter, as shown in FIG. 4E, the first photosensitive resin pattern is removed.

Figure 4F:
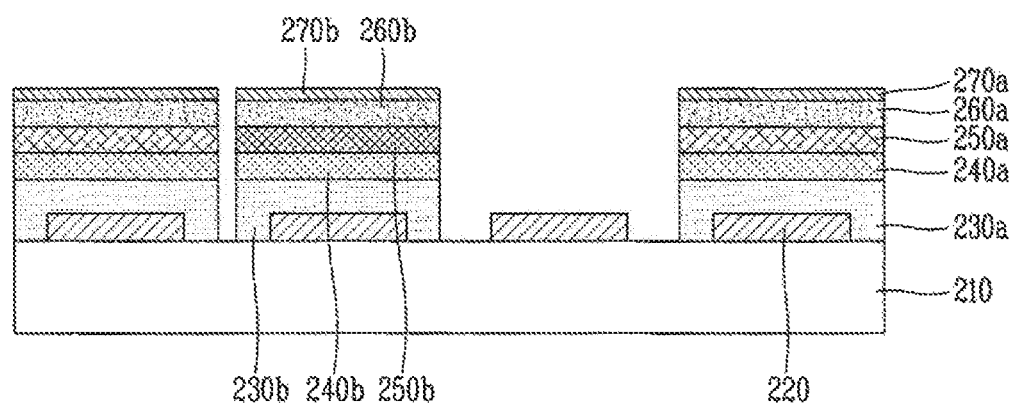

Thereafter, as shown in FIG. 4F, a second hole injection layer 230b, a second hole transport layer 240b, a second light emitting layer 250b, a second electron transport layer 260b, and a second buffer layer 270b, which are formed of a thin film for a second hole injection layer, a thin film for a second hole transport layer, a second organic film, a thin film for a second electron transport layer, and a thin film for a second buffer layer, respectively, are formed on the substrate 210 through a second photo process which is substantially the same as the first photo process as mentioned above.

Here, for example, the second light emitting layer 250b may be a green light emitting layer. However, the present invention is not limited thereto and when the first light emitting layer 250a is a red light emitting layer, the second light emitting layer 250b may be a blue light emitting layer, other than a green light emitting layer.

Figure 4G:
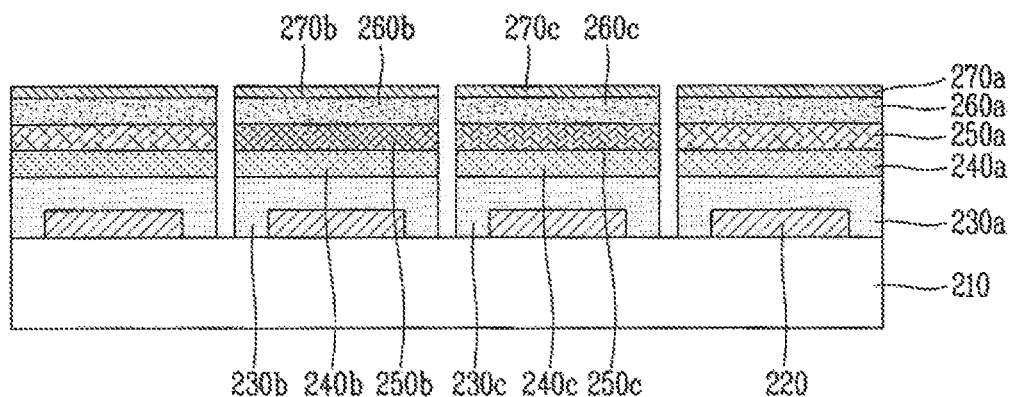

Thereafter, as shown in FIG. 4G, a third hole injection layer 230c, a third hole transport layer 240c, a third light emitting layer 250c, a third electron transport layer 260c, and a third buffer layer 270c, which are formed of a thin film for a third hole injection layer, a thin film for a third hole transport layer, a third organic film, a thin film for a third electron transport layer, and a thin film for a third buffer layer, respectively, are formed on the substrate 210 through a third photo process which is substantially the same as the first and second photo processes as mentioned above.

Here, for example, when the first light emitting layer 250a is a red light emitting layer and the second light emitting layer 250b is a green light emitting layer, the third light emitting layer 250c may be a blue light emitting layer. Also, when the first light emitting layer 250a is a red light emitting layer and the second light emitting layer 250b is a blue light emitting layer, the third light emitting layer 250c may be a green light emitting layer. However, the present invention is not limited thereto and the first light emitting layer 250a, the second light emitting layer 250b, and the third light emitting layer 250c may be configured as red, green, and blue light emitting layers irrespective of order.

Figure 4H:
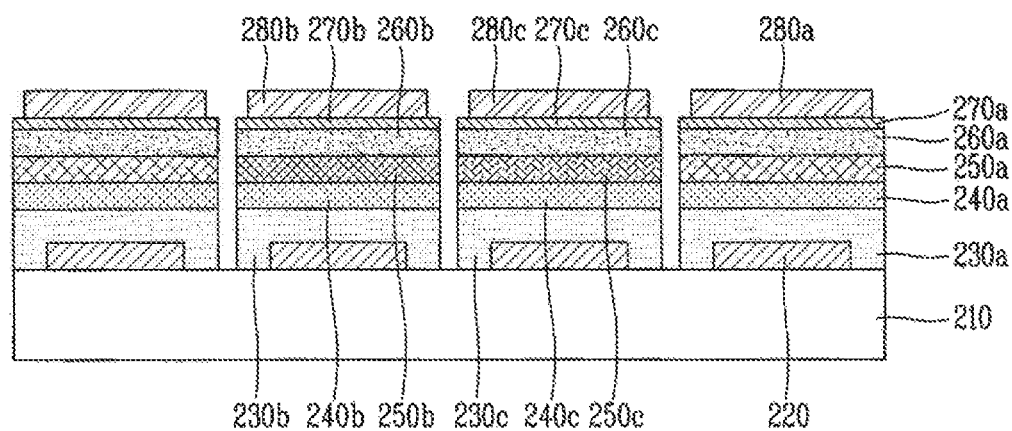

Thereafter, as shown in FIG. 4H, common electrodes 280a, 280b, and 280c as cathodes may be formed on the first buffer layer 270a, the second buffer layer 270b, and the third buffer layer 270c. Here, the common electrodes 280a, 280b, and 280c, which receive a common voltage, may be made of a reflective conductive material including calcium (Ca), barium (Ba), magnesium (Mg), aluminum (Al), silver (Ag), or the like, or a transparent conductive material such as ITO, IZO, or the like.

In the OLED display device configured as described above, the first gate electrode connected to the gate line and the first source electrode and the first drain electrode connected to the data line may constitute a first switching thin film transistor (TFT) along with the first active layer. Also, the second gate electrode connected to the first drain electrode, the second source electrode connected to the driving voltage line, and the second drain electrode connected to the pixel electrode 220 may constitute a driving TFT along with the second active layer.

Also, the pixel electrode 220, the light emitting layers 250a, 250b, and 250c, and the common electrodes 280a, 280b, and 280c may constitute an OLED, and the mutually overlapping storage electrode and driving voltage line may constitute a storage capacitor.

FIGS. 5A through 5G are sequential sectional views illustrating a method for fabricating an OLED display device according to a third embodiment of the present invention, in which a method for fabricating an OLED diode with respect to some pixels is taken as an example.

Although not shown, as mentioned above, in an OLED display device according to a third embodiment of the present invention, a gate line including a first gate electrode and a storage electrode including a second gate electrode may be formed on a substrate 310 made of an insulating material such as transparent glass, plastic, or the like.

A gate insulating layer made of silicon nitride (SiNx), silicon oxide ($SiO_2$), or the like, may be formed on the gate line including the first gate electrode and the storage electrode including the second electrode.

A first active layer and a second active layer, made of semiconductor, may be formed on the gate insulating layer. The first active layer and the second active layer may be positioned on the first gate electrode and the second gate electrode, respectively.

A data line, a driving voltage line, a first source/drain electrode, and a second source/drain electrode may be formed on an upper portion of the first active layer and the second active layer.

A predetermined passivation layer may be formed on the substrate 310 on which the data line, the driving voltage line, the first source/drain electrode, and the second source/drain electrode have been formed.

Figure 5A:
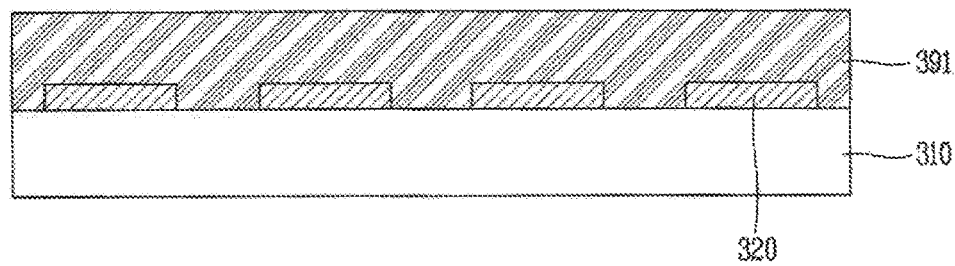
FIGS. 5A through 5G are sequential sectional views illustrating a method for fabricating an OLED display device according to a third embodiment of the present invention.

As shown in FIG. 5A, a pixel electrode 320 and a connecting electrode (not shown) may be formed on the substrate 310 with the passivation film formed thereon. The pixel electrode 320 and the connecting electrode may be made of a transparent conductive material such as indium tin oxide (ITO) or a reflective conductive material such as aluminum, silver, or an alloy thereof.

The pixel electrode 320 as an anode may be electrically connected to the second drain electrode through a second contact hole, and the connecting electrode may electrically connect the first drain electrode and the second gate electrode through a first contact hole and a third contact hole.

A partition (not shown) may be formed on the substrate 310 with the pixel electrode 320 formed thereon. Here, the partition may encompass the edges of the pixel electrode 320, like a bank, to define an opening, and may be made of an organic insulating material or an inorganic insulating material.

An organic compound layer may be formed on the substrate 310. Here, in the case of the third embodiment of the present invention, unlike the second embodiment of the present invention as described above, the organic compound layer is formed through a lift-off process.

Namely, as shown in FIG. 5A, a photosensitive resin is coated on the entire surface of the substrate 310 with the pixel electrode 320 formed thereon, to form a first photosensitive resin layer 391.

UV light is selectively irradiated to the first photosensitive resin layer 391 through a certain mask (not shown).

Figure 5B:
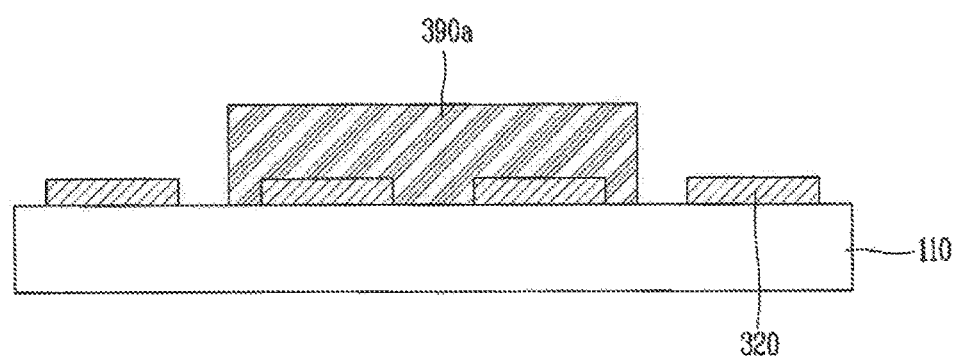

Thereafter, when the first photosensitive resin layer 391 exposed through the mask is developed, a first photosensitive resin pattern 390a made of the photosensitive resin remains only at a position other than a position where a first light emitting layer is to be formed as shown in FIG. 5B.

Figure 5C:
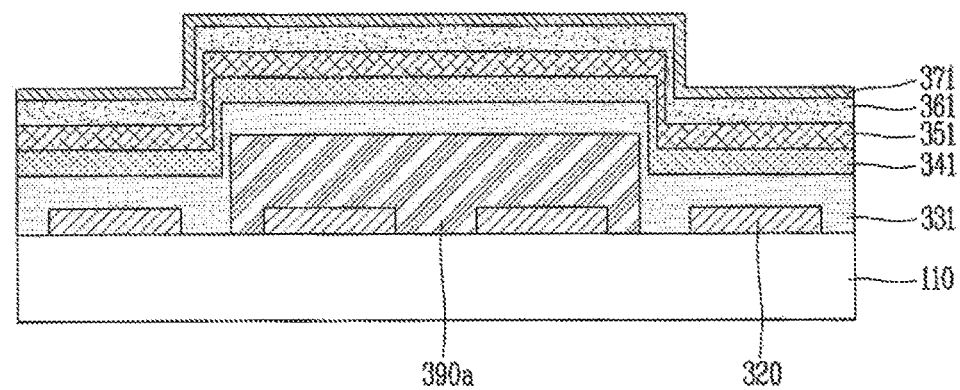

Thereafter, as shown in FIG. 5C, with the first photosensitive resin pattern 390a remaining, a thin film 331 for a first hole injection layer, a thin film 341 for a first hole transport layer, a first inorganic film 351, a thin film 361 for a first electron transport layer, and a thin film 371 for a first buffer layer are deposited on the first photosensitive resin pattern 390a.

Here, the thin film 361 for a first electron transport layer may include a thin film for a first electron injection layer, and the thin film 371 for a first buffer layer may be made of a 1-2 Group and 12-16 Group metal oxide or 3-12 Group transition metal oxide.

Figure 5D:
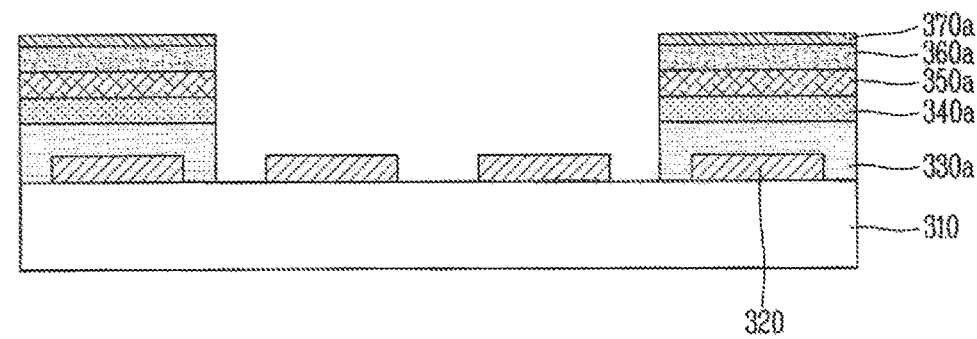

Thereafter, as shown in FIG. 5D, the first photosensitive resin pattern 390a is removed through a first lift-off process. Here, the thin film for a first hole injection layer, the thin film for a first hole transport layer, the first organic film, the thin film for the first electron transport layer, and the thin film for a first buffer layer remaining on the upper portion of the first photosensitive resin pattern 390a are also removed together with the first photosensitive resin pattern 390a.

As a result, a first hole injection layer 330, a first hole transport layer 340a, a first light emitting layer 350a, a first electron transport layer 360a, and a first buffer layer 370a, which are formed of the thin film for a first hole injection layer, the thin film for a first hole transport layer, the first organic film, the thin film for the first electron transport layer, and the thin film for a first buffer layer, respectively, are formed on the substrate 310.

Here, for example, the first light emitting layer 350a may be a red light emitting layer. However, the present invention is not limited thereto and the first light emitting layer 350a may be a green or blue light emitting layer.

Figure 5E:
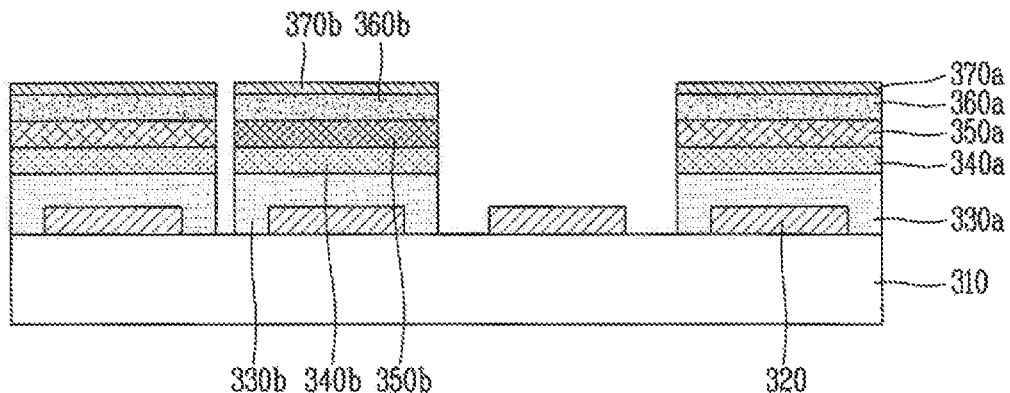

Thereafter, as shown in FIG. 5E, a second hole injection layer 330b, a second hole transport layer 340b, a second light emitting layer 350b, a second electron transport layer 360b, and a second buffer layer 370b, which are formed of a thin film for a second hole injection layer, a thin film for a second hole transport layer, a second organic film, a thin film for a second electron transport layer, and a thin film for a second buffer layer, respectively, are formed on the substrate 310 through a second lift-off process which is substantially the same as the first lift-off process as mentioned above.

Here, for example, the second light emitting layer 350b may be a green light emitting layer. However, the present invention is not limited thereto and when the first light emitting layer 350a is a red light emitting layer, the second light emitting layer 350b may be a blue light emitting layer, other than a green light emitting layer.

Figure 5F:
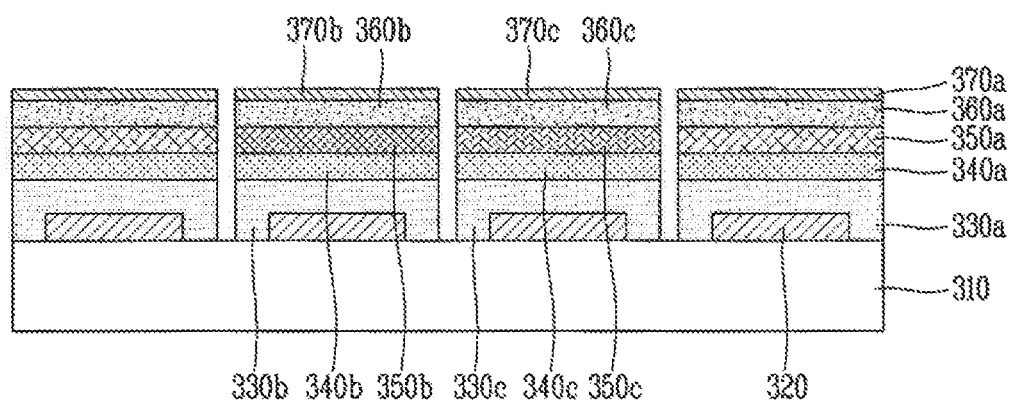

Thereafter, as shown in FIG. 5F, a third hole injection layer 330c, a third hole transport layer 340c, a third light emitting layer 350c, a third electron transport layer 360c, and a third buffer layer 370c, which are formed of a thin film for a third hole injection layer, a thin film for a third hole transport layer, a third organic film, a thin film for a third electron transport layer, and a thin film for a third buffer layer, respectively, are formed on the substrate 310 through a third lift-off process which is substantially the same as the first and second lift-off processes as mentioned above.

Here, for example, when the first light emitting layer 350a is a red light emitting layer and the second light emitting layer 350b is a green light emitting layer, the third light emitting layer 350c may be a blue light emitting layer. Also, when the first light emitting layer 350a is a red light emitting layer and the second light emitting layer 350b is a blue light emitting layer, the third light emitting layer 350c may be a green light emitting layer. However, the present invention is not limited thereto and the first light emitting layer 350a, the second light emitting layer 350b, and the third light emitting layer 350c may be configured as red, green, and blue light emitting layers irrespective of order.

Figure 5G:
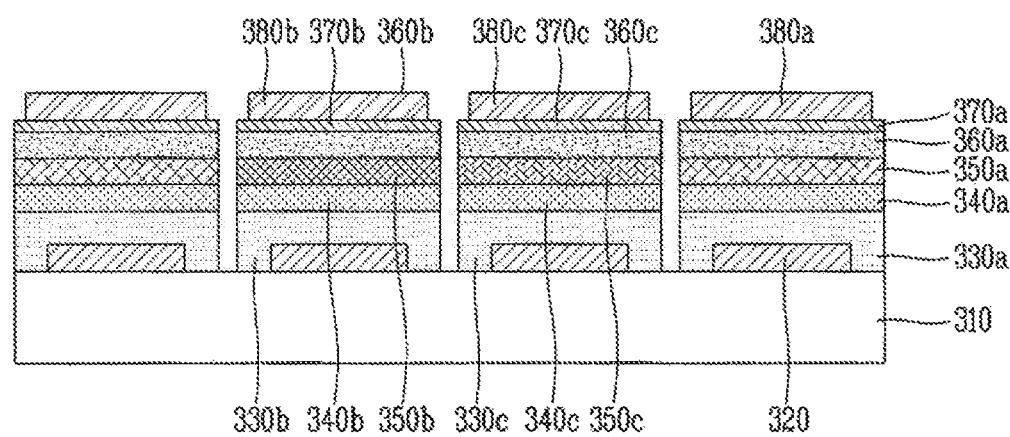

Thereafter, as shown in FIG. 5G, common electrodes 380a, 380b, and 380c as cathodes may be formed on the first light emitting layer 350a, the second light emitting layer 350b, and the third light emitting layer 350c. Here, the common electrodes 380a, 380b, and 380c, which receive a common voltage, may be made of a reflective conductive material including calcium (Ca), barium (Ba), magnesium (Mg), aluminum (Al), silver (Ag), or the like, or a transparent conductive material such as ITO, IZO, or the like.

In the OLED display device configured as described above, the first gate electrode connected to the gate line and the first source electrode and the first drain electrode connected to the data line may constitute a first switching thin film transistor (TFT) along with the first active layer. Also, the second gate electrode connected to the first drain electrode, the second source electrode connected to the driving voltage line, and the second drain electrode connected to the pixel electrode 320 may constitute a driving TFT along with the second active layer.

Also, the pixel electrode 320, the light emitting layers 350a, 350b, and 350c, and the common electrodes 380a, 380b, and 380c may constitute an OLED, and the mutually overlapping storage electrode and driving voltage line may constitute a storage capacitor.

Meanwhile, organic substances whose efficiency and life span are rapidly reduced after the photo process is performed are included in the organic compound layer. For example, in the case of a blue light emitting layer, device efficiency tends to be reduced from about 5.3 cd/A to 2.0 cd/A after a photo process based on 1000 nit.

Figure 6:
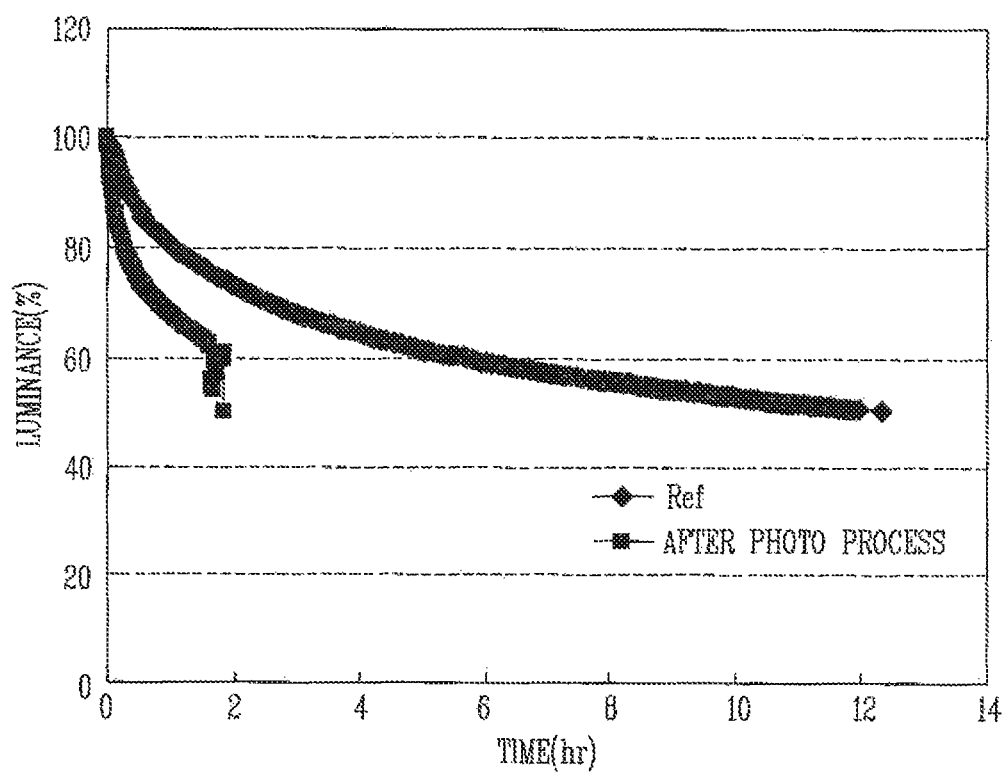
FIG. 6 is a graph showing a state in which a life span of a device is shortened after a photolithography process is performed.

For example, referring to FIG. 6, there is an organic substance whose life span is rapidly reduced after a photo process exists, which leads to a reduction in efficiency and life span of the LED display device.

Thus, in case of a fourth embodiment of the present invention, two pixels among red, green, and blue pixels are patterned through a lift-off process, while the other remaining one pixel is deposited to be formed without patterning, to thus simplify the process and increase efficiency. This will be described in detail with reference to the accompanying drawings.

FIGS. 7A through 7K are sequential sectional views illustrating a method for fabricating an OLED display device according to a fourth embodiment of the present invention, in which a method for fabricating an OLED diode with respect to some pixels is taken as an example.

Although not shown, as mentioned above, in an OLED display device according to a third embodiment of the present invention, a gate line including a first gate electrode and a storage electrode including a second gate electrode may be formed on a substrate 410 made of an insulating material such as transparent glass, plastic, or the like.

A gate insulating layer made of silicon nitride (SiNx), silicon oxide ($SiO_2$), or the like, may be formed on the gate line including the first gate electrode and the storage electrode including the second electrode.

A first active layer and a second active layer, made of semiconductor, may be formed on the gate insulating layer. The first active layer and the second active layer may be positioned on the first gate electrode and the second gate electrode, respectively.

A data line, a driving voltage line, a first source/drain electrode, and a second source/drain electrode may be formed on an upper portion of the first active layer and the second active layer.

A predetermined passivation layer may be formed on the substrate 410 on which the data line, the driving voltage line, the first source/drain electrode, and the second source/drain electrode have been formed.

Figure 7A:
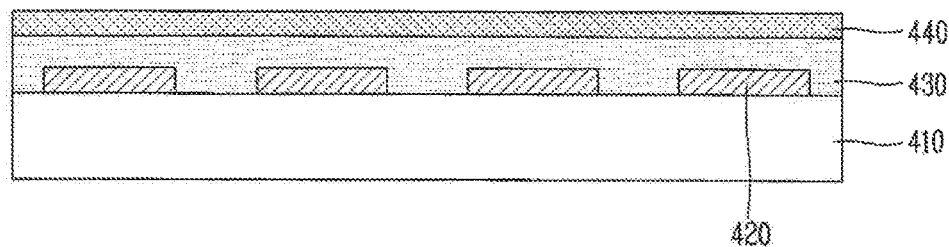
FIGS. 7A through 7K are sequential sectional views illustrating a method for fabricating an OLED display device according to a fourth embodiment of the present invention.

As shown in FIG. 7A, a pixel electrode 420 and a connecting electrode (not shown) may be formed on the substrate 410 with the passivation film formed thereon. The pixel electrode 420 and the connecting electrode may be made of a transparent conductive material such as indium tin oxide (ITO) or a reflective conductive material such as aluminum, silver, or an alloy thereof.

The pixel electrode 420 as an anode may be electrically connected to the second drain electrode through a second contact hole, and the connecting electrode may electrically connect the first drain electrode and the second gate electrode through a first contact hole and a third contact hole.

A partition (not shown) may be formed on the substrate 410 with the pixel electrode 420 formed thereon. Here, the partition may encompass the edges of the pixel electrode 420, like a bank, to define an opening, and may be made of an organic insulating material or an inorganic insulating material.

An organic compound layer may be formed on the substrate 410. Here, in the case of the fourth embodiment of the present invention, two pixels among red, green, and blue pixels are patterned through a lift-off process, while the other remaining one pixel is deposited to be formed without patterning, to form the organic compound layer.

Namely, as shown in FIG. 7A, a hole injection layer 430 and a hole transport layer 440 are formed on the substrate 410 with the pixel electrode 420 formed thereon.

As mentioned above, the hole injection layer 430 may facilitate injection of holes from the pixel electrode 420, and the hole transport layer 440 serves to allow holes to be transported to the light emitting layer.

Figure 7B:
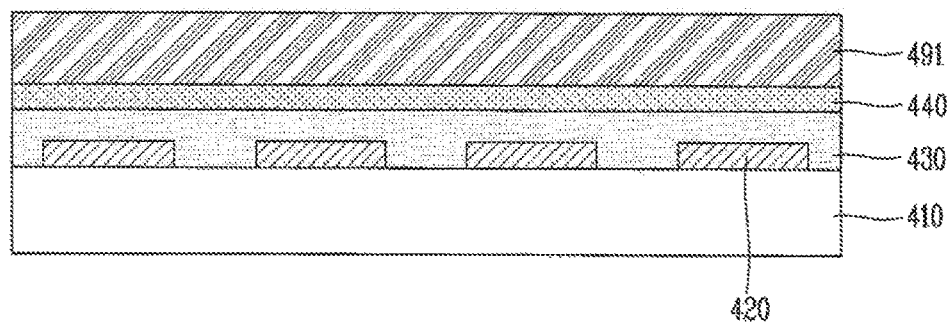

Thereafter, as shown in FIG. 7B, a photosensitive resin is coated on the entire surface of the substrate 410 with the hole injection layer 430 and the hole transport layer 440 formed thereon, to form a first photosensitive resin layer 491.

UV light is selectively irradiated to the first photosensitive resin layer 491 through a certain mask (not shown).

Figure 7C:
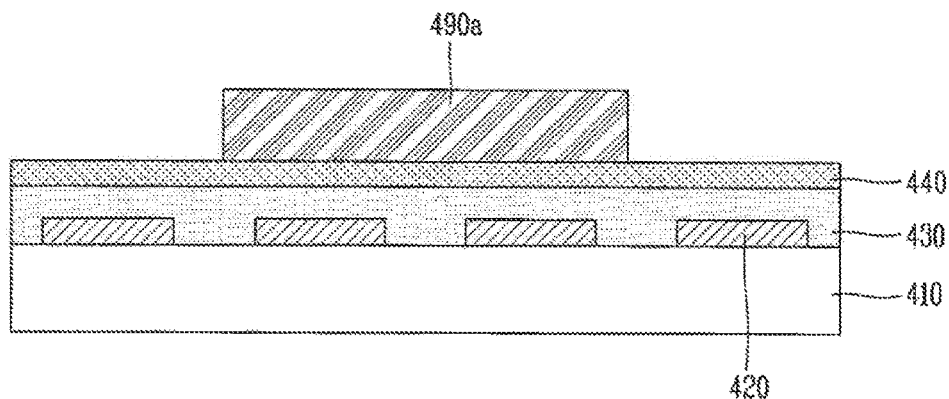

Thereafter, when the first photosensitive resin layer 491 exposed through the mask is developed, a first photosensitive resin pattern 490*a* made of the photosensitive resin remains only at a position other than a position where a first light emitting layer is to be formed as shown in FIG. 7C.

Figure 7D:
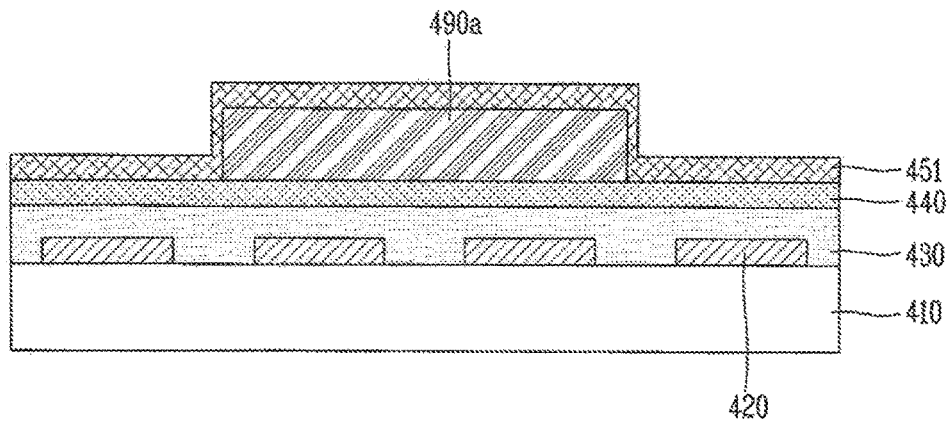

Thereafter, as shown in FIG. 7D, with the first photosensitive resin pattern 490*a* remaining, a first organic film 451 is deposited thereon.

Figure 7E:
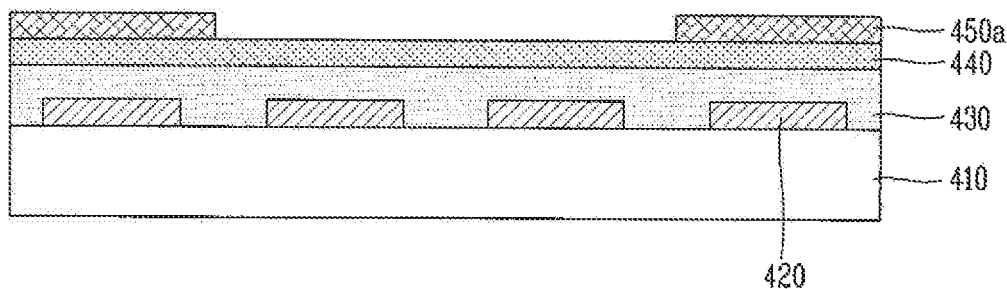

Thereafter, as shown in FIG. 7E, the first photosensitive resin pattern 490*a* is removed through a first lift-off process. Here, the first organic film 451 remaining on the upper portion of the first photosensitive resin pattern 490*a* is also removed together with the first photosensitive resin pattern 490*a*.

As a result, a first light emitting layer 450*a* formed of the first organic film is formed on the substrate 410.

Here, for example, the first light emitting layer 450*a* may be a red light emitting layer. However, the present invention is not limited thereto and the first light emitting layer 450*a* may be a green or blue light emitting layer.

Figure 7F:
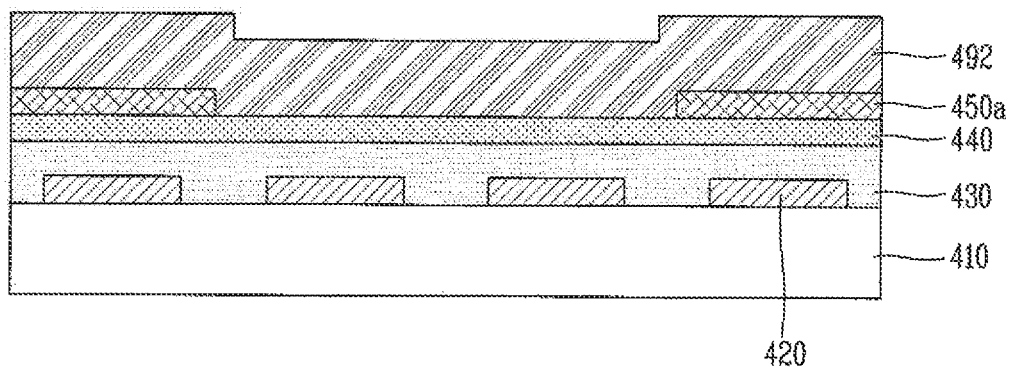

As shown in FIG. 7F, a second photosensitive resin layer 492 may be formed by applying a photosensitive resin to the entire surface of the substrate 410 with the first light emitting layer 450*a* formed thereon in the substantially same manner.

And then, UV light is selectively irradiated to the second photosensitive resin layer 492 through a certain mask (not shown).

Figure 7G:
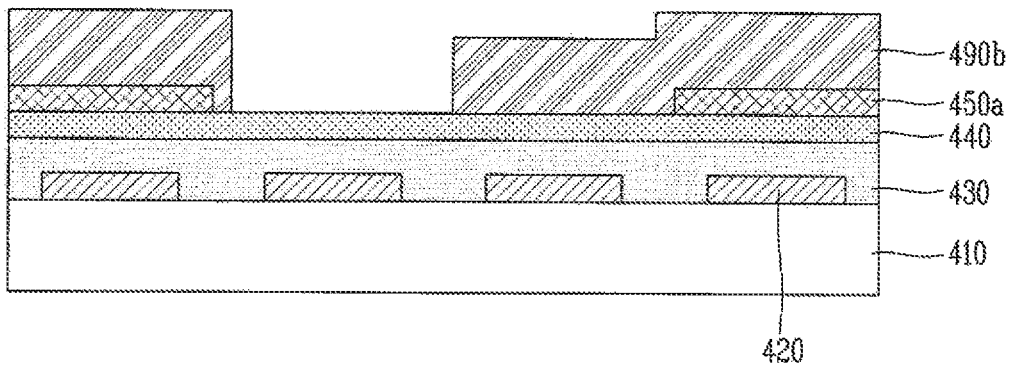

Thereafter, when the second photosensitive resin layer 492 exposed through the mask is developed, a second photosensitive resin pattern 490*b* made of the photosensitive resin remains only at a position other than a position where a second light emitting layer is to be formed as shown in FIG. 7G.

Figure 7H:
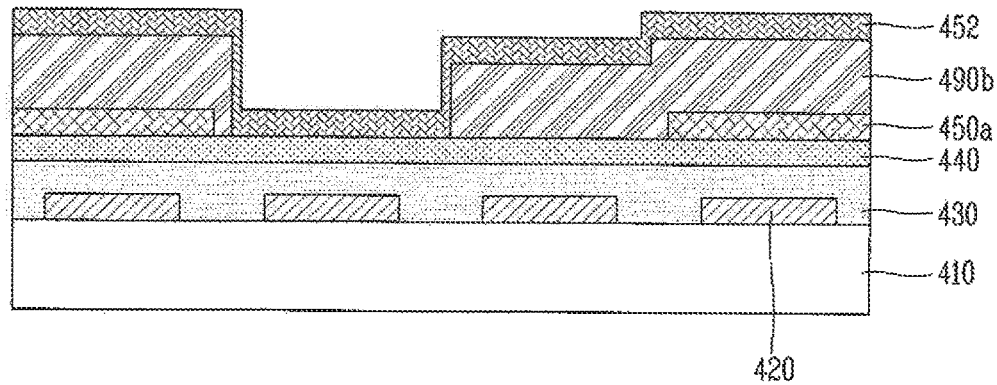

Thereafter, as shown in FIG. 7H, with the second photosensitive resin pattern 490*b* remaining, a second organic film 452 is deposited thereon.

Figure 7I:
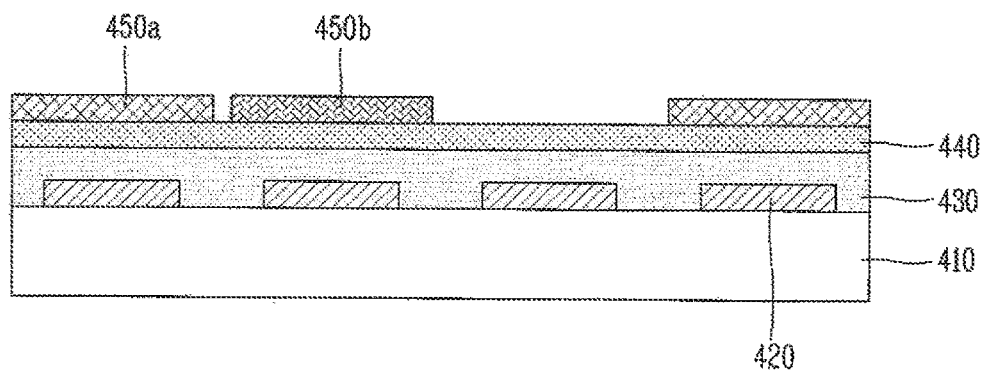

Thereafter, as shown in FIG. 7I, the second photosensitive resin pattern 490*b* is removed through second first lift-off process. Here, the second organic film 452 remaining on the upper portion of the second photosensitive resin pattern 490*b* is also removed together with the second photosensitive resin pattern 490*b*.

As a result, a second light emitting layer 450*b* formed of the second organic film is formed on the substrate 410.

Here, for example, the second emitting layer 450*b* may be a green light emitting layer. However, the present invention is not limited thereto and when the first light emitting layer 450*a* is a red light emitting layer, the second light emitting layer 450*b* may be a blue light emitting layer, other than a green light emitting layer.

Figure 7J:
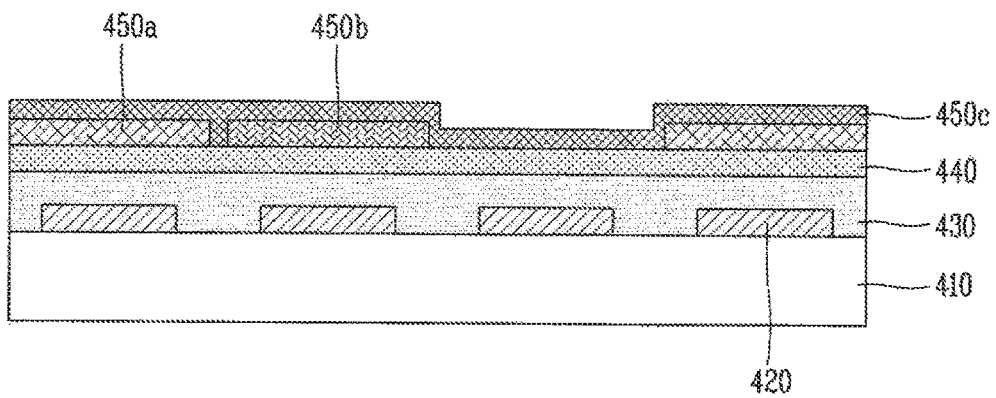

As shown in FIG. 7J, a third organic film is deposited on the entire surface of the substrate 410 with the first light emitting layer 450*a* and the second light emitting layer 450*b* formed thereon, to form a third light emitting layer 450*c*.

Here, the third light emitting layer 450*c* may be formed with a certain thickness on upper portions of the first light emitting layer 450*a* and the second light emitting layer 450*b* as well as between the first light emitting layer 450*a* and the second light emitting layer 450*b*.

Here, for example, when the first light emitting layer 450*a* is a red light emitting layer and the second light emitting layer 450*b* is a green light emitting layer, the third light emitting layer 450*c* may be a blue light emitting layer. Also, when the first light emitting layer 450*a* is a red light emitting layer and the second light emitting layer 450*b* is a blue light emitting layer, the third light emitting layer 450*c* may be a green light emitting layer. However, the present invention is not limited thereto and the first light emitting layer 450a, the second light emitting layer 450b, and the third light emitting layer 450c may be configured as red, green, and blue light emitting layers irrespective of order.

Figure 7K:
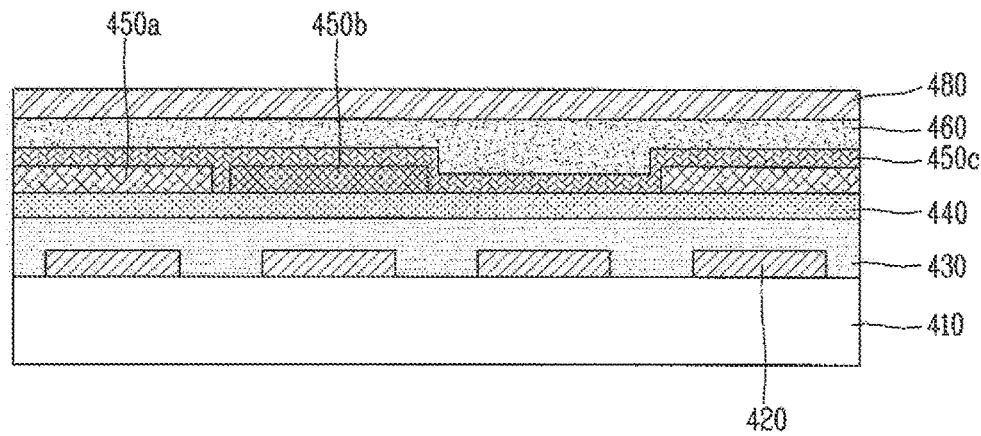

Thereafter, as shown in FIG. 7K, an electron transport layer 460 and a common electrode 480 as a cathode are formed on the substrate 410 on which the first light emitting layer 450a, the second light emitting layer 450b, and the third light emitting layer 450c have been formed.

Here, the electron transport layer 460 may include an electron injection layer. The common electrode 480, which receives a common voltage, may be made of a reflective conductive material including calcium (Ca), barium (Ba), magnesium (Mg), aluminum (Al), silver (Ag), or the like, or a transparent conductive material.

In the OLED display device configured as described above, the first gate electrode connected to the gate line and the first source electrode and the first drain electrode connected to the data line may constitute a first switching thin film transistor (TFT) along with the first active layer. Also, the second gate electrode connected to the first drain electrode, the second source electrode connected to the driving voltage line, and the second drain electrode connected to the pixel electrode 220 may constitute a driving TFT along with the second active layer.

Also, the pixel electrode 420, the light emitting layers 450a, 450b, and 450c, and the common electrode 480 may constitute an OLED, and the mutually overlapping storage electrode and driving voltage line may constitute a storage capacitor.

In this manner, for example, when the first light emitting layer 450a, the second light emitting layer 450b, and the third light emitting layer 450c are a red light emitting layer, a green light emitting layer, and a blue light emitting layer, respectively, the red light emitting layer and the green light emitting layer are patterned through a lift-off process and the blue light emitting layer may be commonly formed on the entire surface.

However, the present invention is not limited thereto. Namely, the green light emitting layer and the blue light emitting layer may be patterned through a lift-off process while the red light emitting layer may be commonly formed on the entire surface, or the red light emitting layer and the blue light emitting layer may be patterned through a lift-off process while the green light emitting layer may be commonly formed on the entire surface.

Figure 8:
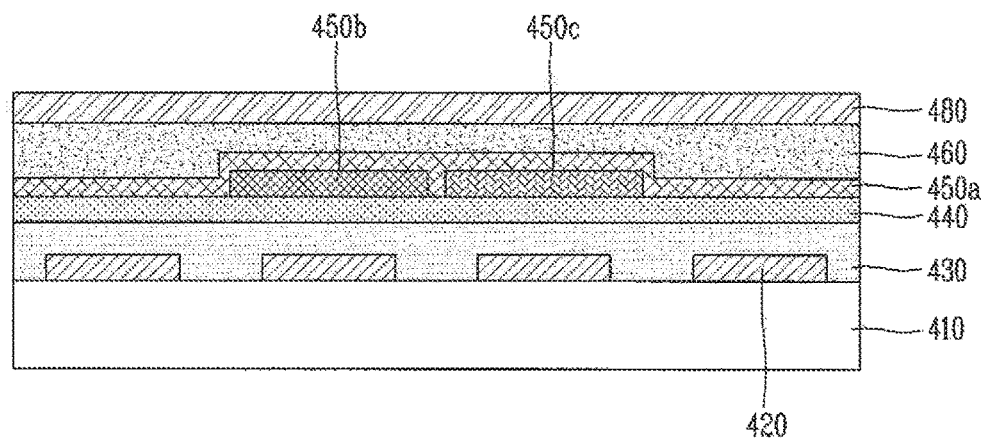
FIG. 8 is a sectional view showing another example of an OLED display device fabricated according to the fourth embodiment of the present invention illustrated in FIGS. 7A through 7K.

FIG. 8 is a sectional view showing another example of an OLED display device fabricated according to the fourth embodiment of the present invention illustrated in FIGS. 7A through 7K, in which a first organic film is deposited on the entire surface of the substrate 410 with the second light emitting layer 450b and the third light emitting layer 450c formed thereon, to from the first light emitting layer 450a.

Here, the first light emitting layer 450a is formed with a certain thickness even on upper portions of the second light emitting layer 450b and the third light emitting layer 450c, as well as between the second light emitting layer 450b and the third light emitting layer 450c.

Figure 9:
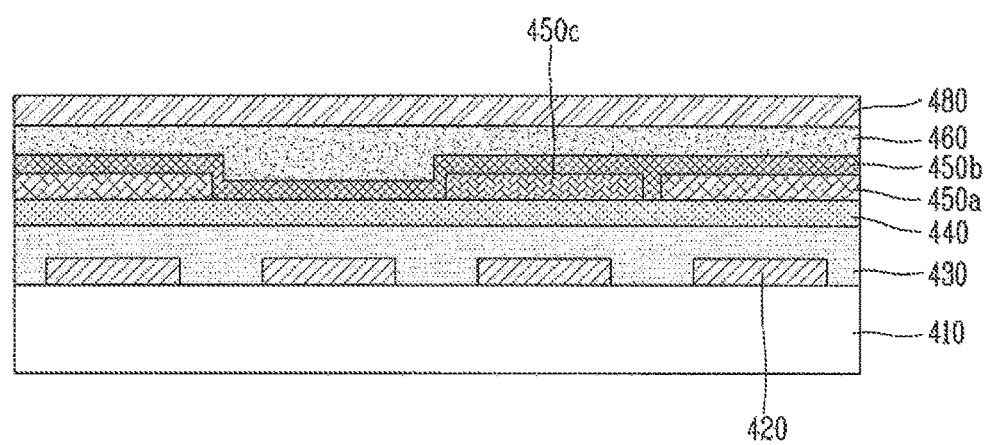
FIG. 9 is a sectional view showing another example of an OLED display device fabricated according to the fourth embodiment of the present invention illustrated in FIGS. 7A through 7K.

FIG. 9 is a sectional view showing another example of an OLED display device fabricated according to the fourth embodiment of the present invention illustrated in FIGS. 7A through 7K, in which a second inorganic film is deposited on the entire surface of the substrate 410 with the first light emitting layer 450a and the third light emitting layer 450c formed thereon, to form the second light emitting layer 450b.

Here, the second light emitting layer 450b is formed with a certain thickness even on upper portions of the first light emitting layer 450a and the third light emitting layer 450c, as well as between the first light emitting layer 450a and the third light emitting layer 450c.

Meanwhile, damage to an organic compound layer due to a photo process may be prevented according to other methods than those of the second and third embodiments of the present invention. Namely, an organic compound layer may be protected against a photo process by patterning the organic compound layer by using a cathode as a mask. This will be described in detail according to fifth and sixth embodiments of the present invention.

FIGS. 10A through 10H are sequential sectional views illustrating a method for fabricating an OLED display device according to a fifth embodiment of the present invention.

Although not shown, in an OLED display device according to a fifth embodiment of the present invention, a gate line including a first gate electrode and a storage electrode including a second gate electrode may be formed on a substrate 510 made of an insulating material such as transparent glass, plastic, or the like.

A gate insulating layer made of silicon nitride (SiNx), silicon oxide ($SiO_2$), or the like, may be formed on the gate line including the first gate electrode and the storage electrode including the second electrode.

A first active layer and a second active layer, made of semiconductor, may be formed on the gate insulating layer. The first active layer and the second active layer may be positioned on the first gate electrode and the second gate electrode, respectively.

A data line, a driving voltage line, a first source/drain electrode, and a second source/drain electrode may be formed on an upper portion of the first active layer and the second active layer.

A predetermined passivation layer may be formed on the substrate 510 on which the data line, the driving voltage line, the first source/drain electrode, and the second source/drain electrode have been formed.

Figure 10A:
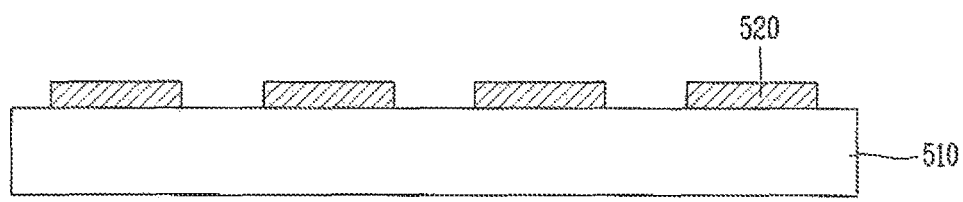
FIGS. 10A through 10H are sequential sectional views illustrating a method for fabricating an OLED display device according to a fifth embodiment of the present invention.

As shown in FIG. 10A, a pixel electrode 520 and a connecting electrode (not shown) may be formed on the substrate 510 with the passivation film formed thereon. The pixel electrode 520 and the connecting electrode may be made of a transparent conductive material such as indium tin oxide (ITO) or a reflective conductive material such as aluminum, silver, or an alloy thereof.

The pixel electrode 520 as an anode may be electrically connected to the second drain electrode through a second contact hole, and the connecting electrode may electrically connect the first drain electrode and the second gate electrode through a first contact hole and a third contact hole.

A partition (not shown) may be formed on the substrate 510 with the pixel electrode 520 formed thereon. Here, the partition may encompass the edges of the pixel electrode 520, like a bank, to define an opening, and may be made of an organic insulating material or an inorganic insulating material.

An organic compound layer may be formed on the substrate 510.

Here, the organic compound layer may have a multilayer structure including an auxiliary layer in order to enhance luminous efficiency of a light emitting layer that emits light, besides the light emitting layer. The auxiliary layer may include an electron transport layer and a hole transport layer for balancing electrons and holes and an electron injection layer and a hole injection layer for strengthening injection of electrons and holes.

Figure 10B:
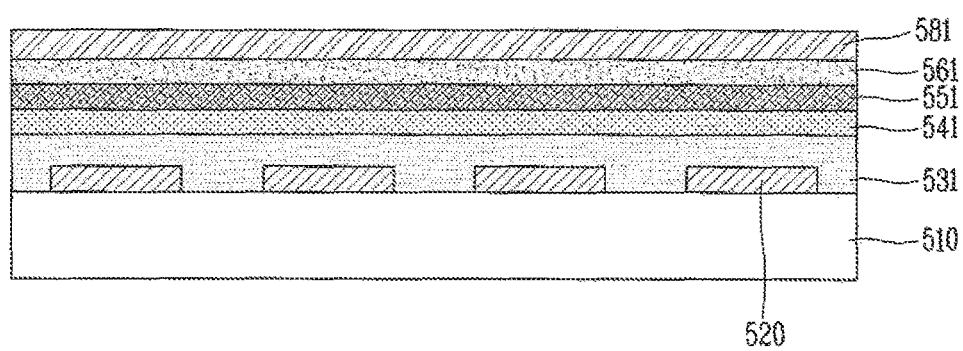

Namely, as shown in FIG. 10B, a thin film 531 for a first hole injection layer, a thin film 541 for a first hole transport layer, a first organic film 551, a thin film 561 for a first electron transport layer, and a first conductive film 581 are sequentially deposited on the substrate 510 with the pixel electrode 520 formed thereon.

Here, the thin film 561 for a first electron transport layer may include a thin film for a first electron injection layer, and the first conductive film 581 may be made of a reflective conductive material including calcium (Ca), barium (Ba), magnesium (Mg), aluminum (Al), silver (Ag), or the like, or a transparent conductive material such as ITO, IZO, or the like.

Figure 10C:
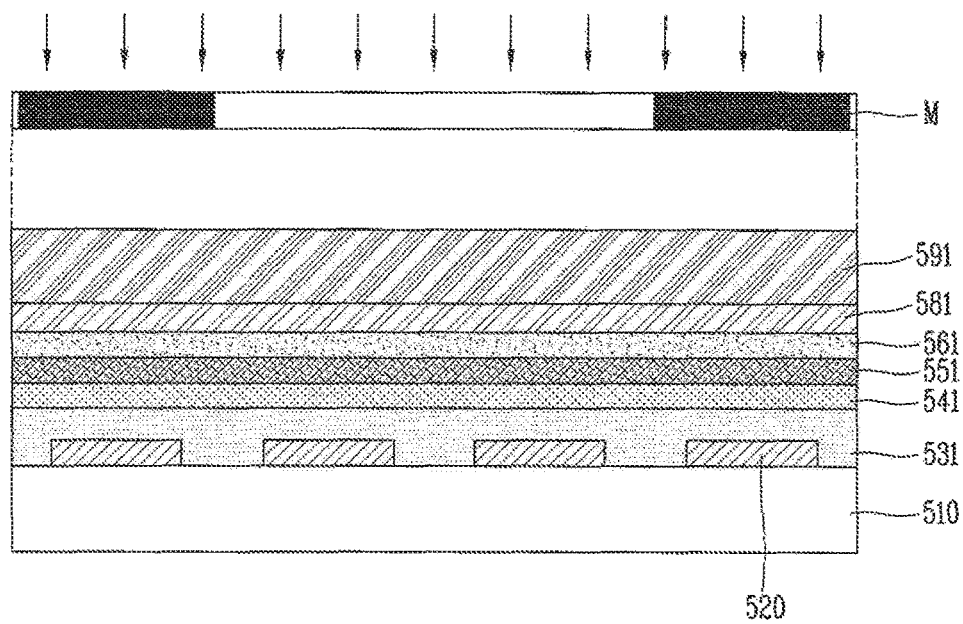

Thereafter, as shown in FIG. 10C, a photosensitive resin is coated on the entire surface of the substrate 510, on which the thin film 531 for a first hole injection layer, the thin film 541 for a first hole transport layer, the first organic film 551, the thin film 561 for a first electron transport layer, and the first conductive film 581 have been deposited, to form a first photosensitive resin layer 591.

Thereafter, UV rays are selectively irradiated to the first photosensitive resin layer 591 through a certain mask M.

Figure 10D:
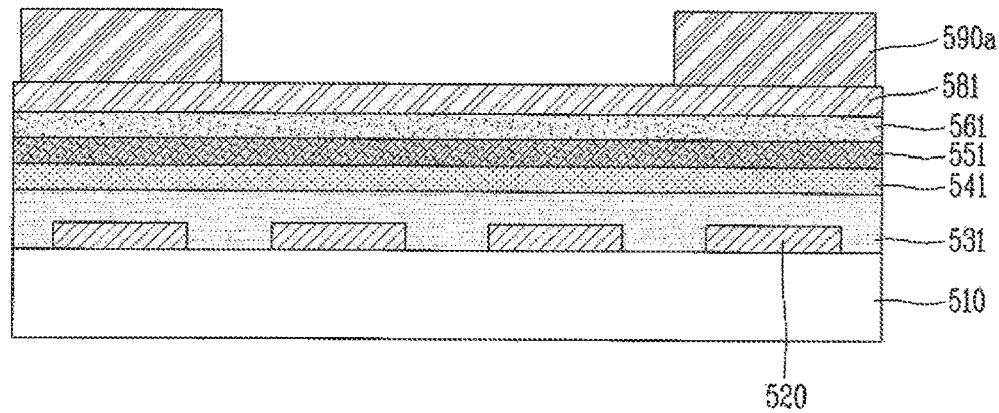

Thereafter, when the first photosensitive resin layer 591 exposed through the mask M is developed, a first photosensitive resin pattern 590a made of the photosensitive resin remains only at a position where a first light emitting layer is to be formed as shown in FIG. 10D.

Here, the first photosensitive resin pattern 590a may be patterned to have at least the same width as that of the underlying pixel electrode 520 in consideration of an alignment error of the mask M and other processing errors.

Figure 10E:
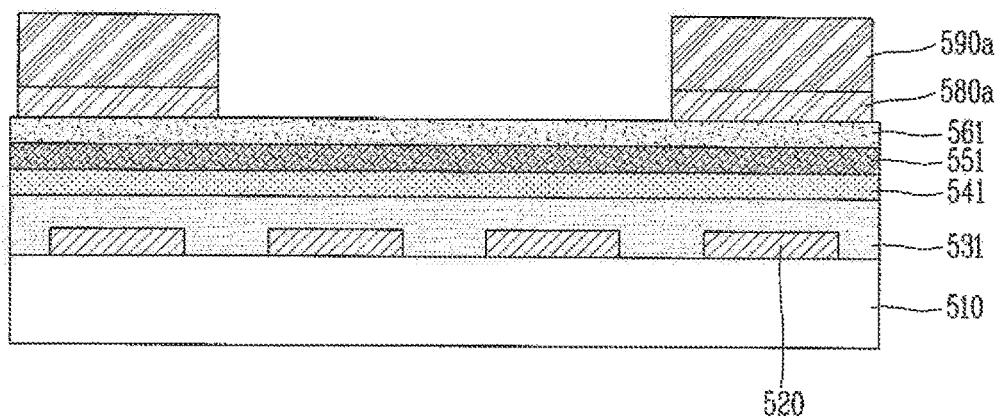

Thereafter, as shown in FIG. 10E, when a partial region of first conductive film formed under the first photosensitive resin pattern 590a is selectively etched by using the first photosensitive resin pattern 590a as a mask, a first common electrode 580a formed of the first conductive film is formed at a position where the first light emitting layer is to be formed.

Here, the etching may include wet etching as well as dry etching.

Figure 10F:
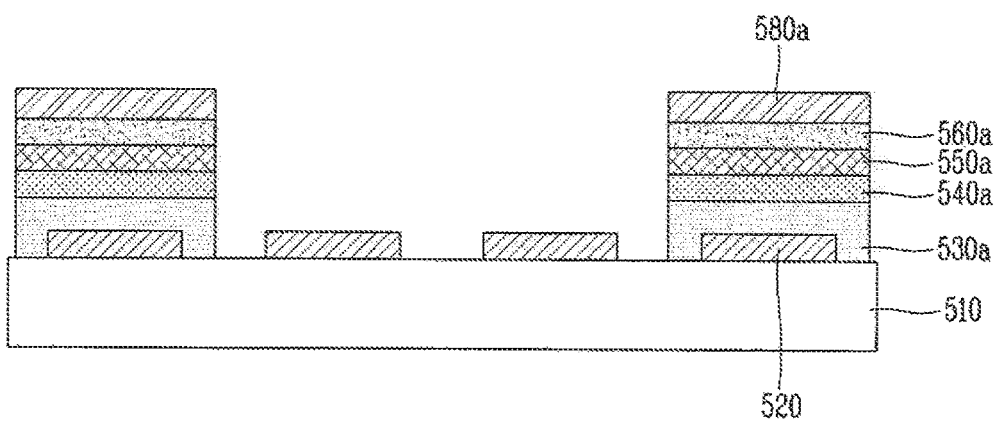

Thereafter, as shown in FIG. 10F, a remnant of the first photosensitive resin pattern is removed through ashing, stripping, or the like, and here, as partial regions of the thin film for a first hole injection layer, the thin film for a first hole transport layer, the first organic film, and the thin film for a first electron transport layer exposed thereunder are selectively removed by using the first common electrode 580a as a mask, a first hole injection layer 530a, a first hole transport layer 540a, a first light emitting layer 550a, and a first electron transport layer 560a, which are formed of the thin film for a first hole injection layer, the thin film for a first hole transport layer, the first organic film, and the thin film for a first electron transport layer, respectively, are formed (a first photo process).

In this manner, since the first common electrode 580a is positioned as a barrier layer on an upper portion of the organic compound layer, namely, on the first electron transport layer 560a, the organic compound layer, in particular, the first electron transport layer 560a, can be prevented from being degraded during the photo process, thus preventing a degradation of the device.

Here, the first light emitting layer 550a may be a red light emitting layer, but the present invention is not limited thereto and the first light emitting layer 550a may be a green or blue light emitting layer.

Figure 10G:
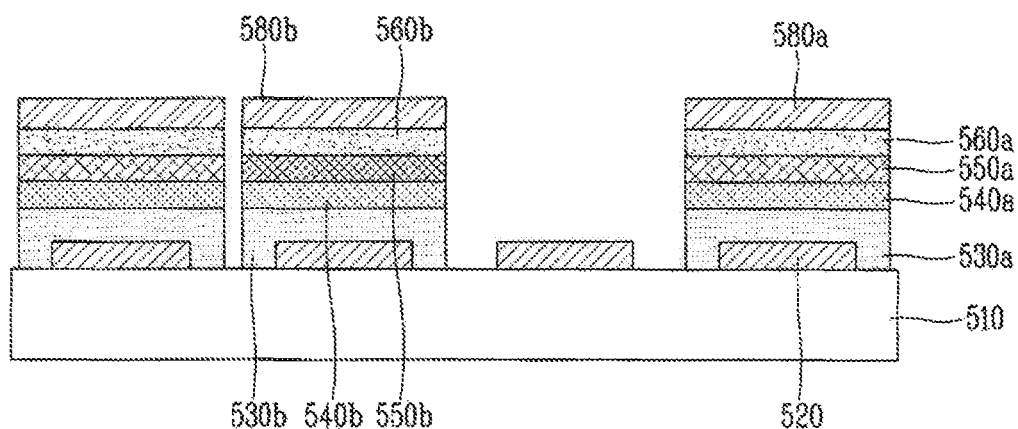

Next, as shown in FIG. 10G, a second hole injection layer 530b, a second hole transport layer 540b, a second light emitting layer 550b, a second electron transport layer 560b, and a second common electrode 580b, which are formed of a thin film for a second hole injection layer, a thin film for a second hole transport layer, a second organic film, a thin film for a second electron transport layer, and a second conductive film, respectively, are formed on the substrate 510 through a second photo process which is substantially the same as the first photo process as mentioned above.

Here, the second conductive film may be made of a reflective conductive material including calcium (Ca), barium (Ba), magnesium (Mg), aluminum (Al), silver (Ag), or the like, or a transparent conductive material such as ITO, IZO, or the like.

Here, for example, the second light emitting layer 550b may be a green light emitting layer. However, the present invention is not limited thereto and when the first light emitting layer 550a is a red light emitting layer, the second light emitting layer 550b may be a blue light emitting layer, other than a green light emitting layer.

Figure 10H:
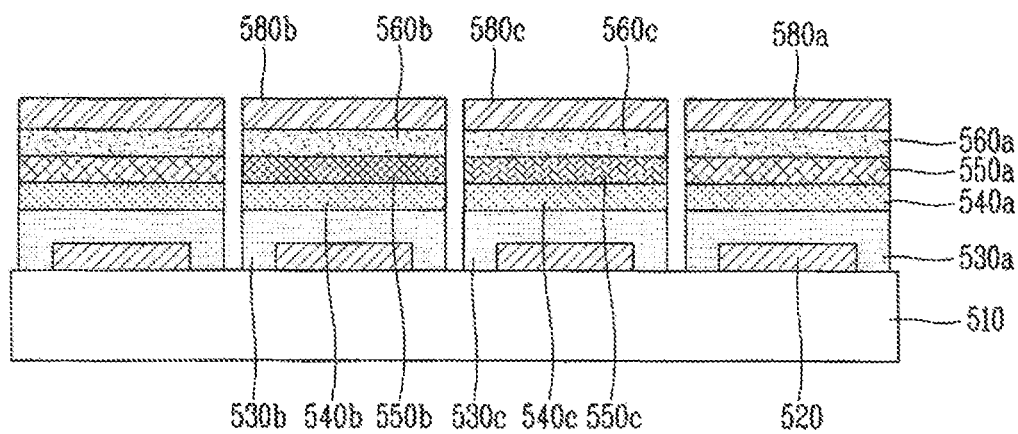

Thereafter, as shown in FIG. 10H, a third hole injection layer 530c, a third hole transport layer 540c, a third light emitting layer 550c, a third electron transport layer 560c, and a third common electrode 580c, which are formed of a thin film for a third hole injection layer, a thin film for a third hole transport layer, a third organic film, a thin film for a third electron transport layer, and a third conductive film, respectively, are formed on the substrate 510 through a third photo process which is substantially the same as the first and second photo processes as mentioned above.

Here, the third conductive film may be made of a reflective conductive material including calcium (Ca), barium (Ba), magnesium (Mg), aluminum (Al), silver (Ag), or the like, or a transparent conductive material such as ITO, IZO, or the like.

Here, for example, when the first light emitting layer 550a is a red light emitting layer and the second light emitting layer 550b is a green light emitting layer, the third light emitting layer 550c may be a blue light emitting layer. Also, when the first light emitting layer 550a is a red light emitting layer and the second light emitting layer 550b is a blue light emitting layer, the third light emitting layer 550c may be a green light emitting layer. However, the present invention is not limited thereto and the first light emitting layer 550a, the second light emitting layer 550b, and the third light emitting layer 550c may be configured as red, green, and blue light emitting layers irrespective of order.

In the OLED display device configured as described above, the first gate electrode connected to the gate line and the first source electrode and the first drain electrode connected to the data line may constitute a first switching thin film transistor (TFT) along with the first active layer. Also, the second gate electrode connected to the first drain electrode, the second source electrode connected to the driving voltage line, and the second drain electrode connected to the pixel electrode 520 may constitute a driving TFT along with the second active layer.

Also, the pixel electrode 520, the light emitting layers 550a, 550b, and 550c, and the common electrodes 580a, 580b, and 580c may constitute an OLED, and the mutually overlapping storage electrode and driving voltage line may constitute a storage capacitor.

Here, in the OLED display device according to the fifth embodiment of the present invention, the organic compound layer and the common electrodes are patterned at intervals between neighboring pixels, but the present invention is not limited thereto.

FIGS. 11A through 11H are sequential sectional views illustrating a method for fabricating an OLED display device according to a sixth embodiment of the present invention, in which a method for fabricating an OLED diode with respect to some pixels is taken as an example.

In this case, the OLED display device according to a sixth embodiment of the present invention has the same configuration as that of the fifth embodiment of the present invention, except that the organic compound layer and the common electrodes are patterned to be in contact with each other between neighboring pixels.

Although not shown, in an OLED display device according to the sixth embodiment of the present invention, a gate line including a first gate electrode and a storage electrode including a second gate electrode may be formed on a substrate 610 made of an insulating material such as transparent glass, plastic, or the like.

A gate insulating layer made of silicon nitride (SiNx), silicon oxide (SiO$_2$), or the like, may be formed on the gate line including the first gate electrode and the storage electrode including the second electrode.

A first active layer and a second active layer, made of semiconductor, may be formed on the gate insulating layer. The first active layer and the second active layer may be positioned on the first gate electrode and the second gate electrode, respectively.

A data line, a driving voltage line, a first source/drain electrode, and a second source/drain electrode may be formed on an upper portion of the first active layer and the second active layer.

A predetermined passivation layer may be formed on the substrate 610 on which the data line, the driving voltage line, the first source/drain electrode, and the second source/drain electrode have been formed.

Figure 11A:
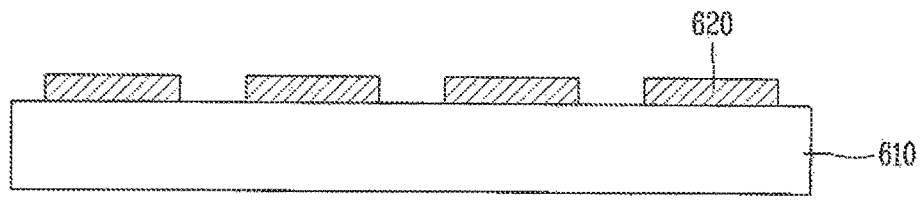
FIGS. 11A through 11H are sequential sectional views illustrating a method for fabricating an OLED display device according to a sixth embodiment of the present invention.

As shown in FIG. 11A, a pixel electrode 620 and a connecting electrode (not shown) may be formed on the substrate 610 with the passivation film formed thereon. The pixel electrode 620 and the connecting electrode may be made of a transparent conductive material such as indium tin oxide (ITO) or a reflective conductive material such as aluminum, silver, or an alloy thereof.

The pixel electrode 620 as an anode may be electrically connected to the second drain electrode through a second contact hole, and the connecting electrode may electrically connect the first drain electrode and the second gate electrode through a first contact hole and a third contact hole.

A partition (not shown) may be formed on the substrate 610 with the pixel electrode 620 formed thereon. Here, the partition may encompass the edges of the pixel electrode 620, like a bank, to define an opening, and may be made of an organic insulating material or an inorganic insulating material.

An organic compound layer may be formed on the substrate 610.

Here, the organic compound layer may have a multilayer structure including an auxiliary layer in order to enhance luminous efficiency of a light emitting layer that emits light, besides the light emitting layer. The auxiliary layer may include an electron transport layer and a hole transport layer for balancing electrons and holes and an electron injection layer and a hole injection layer for strengthening injection of electrons and holes.

Figure 11B:
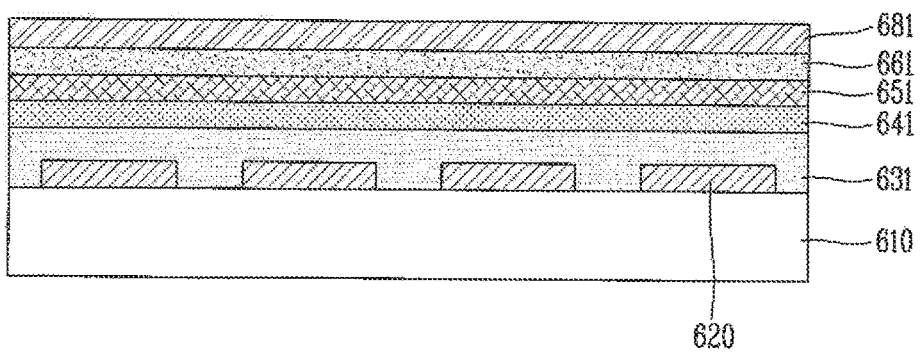

Namely, as shown in FIG. 11B, a thin film 631 for a first hole injection layer, a thin film 641 for a first hole transport layer, a first organic film 651, a thin film 661 for a first electron transport layer, and a first conductive film 681 are sequentially deposited on the substrate 610 with the pixel electrode 620 formed thereon.

Here, the thin film 661 for a first electron transport layer may include a thin film for a first electron injection layer, and the first conductive film 681 may be made of a reflective conductive material including calcium (Ca), barium (Ba), magnesium (Mg), aluminum (Al), silver (Ag), or the like, or a transparent conductive material such as ITO, IZO, or the like.

Figure 11C:
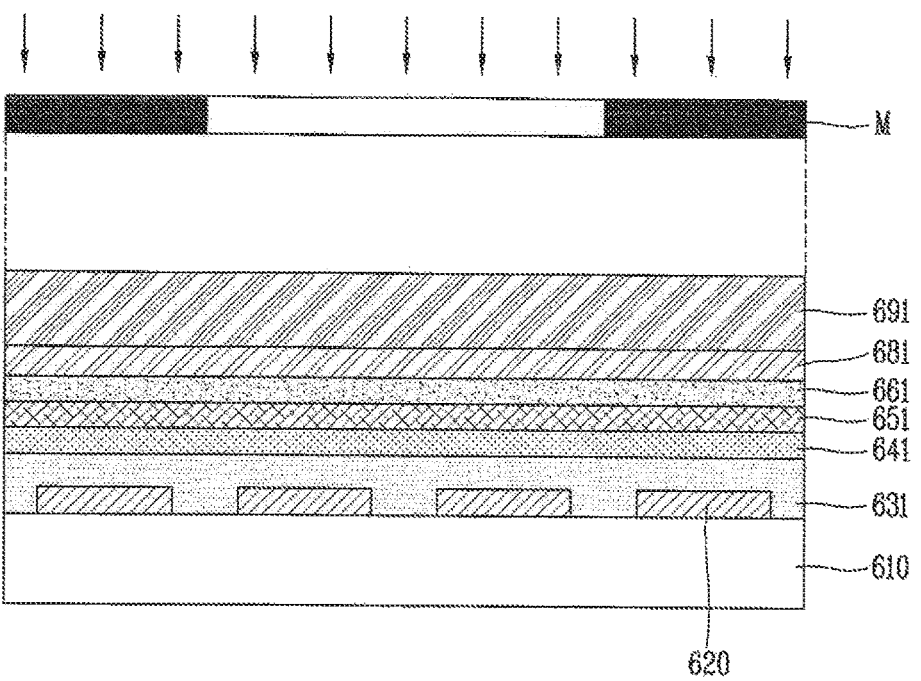

Thereafter, as shown in FIG. 11C, a photosensitive resin is coated on the entire surface of the substrate 610, on which the thin film 631 for a first hole injection layer, the thin film 641 for a first hole transport layer, the first organic film 651, the thin film 661 for a first electron transport layer, and the first conductive film 681 have been deposited, to form a first photosensitive resin layer 691.

Thereafter, UV rays are selectively irradiated to the first photosensitive resin layer 691 through a certain mask M.

Figure 11D:
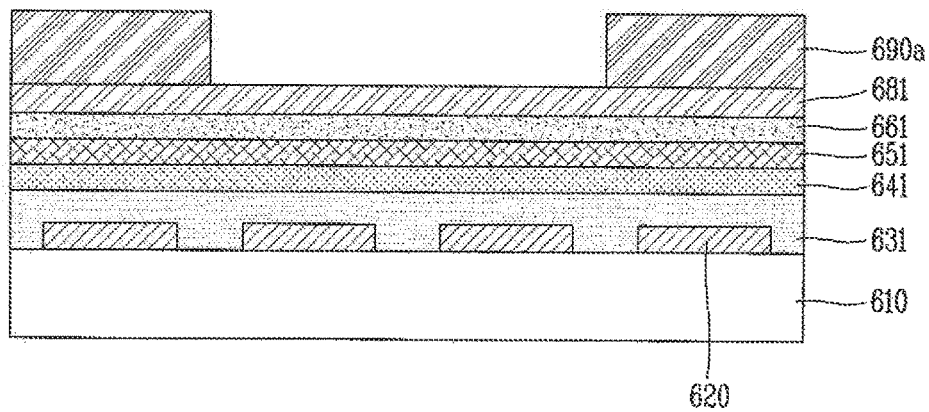

Thereafter, when the first photosensitive resin layer 691 exposed through the mask M is developed, a first photosensitive resin pattern 690a made of the photosensitive resin remains only at a position where a first light emitting layer is to be formed as shown in FIG. 11D.

Here, the first photosensitive resin pattern 690a may be patterned such that the organic compound layer and a common electrode are patterned to be in contact with each other between neighboring pixels.

Figure 11E:
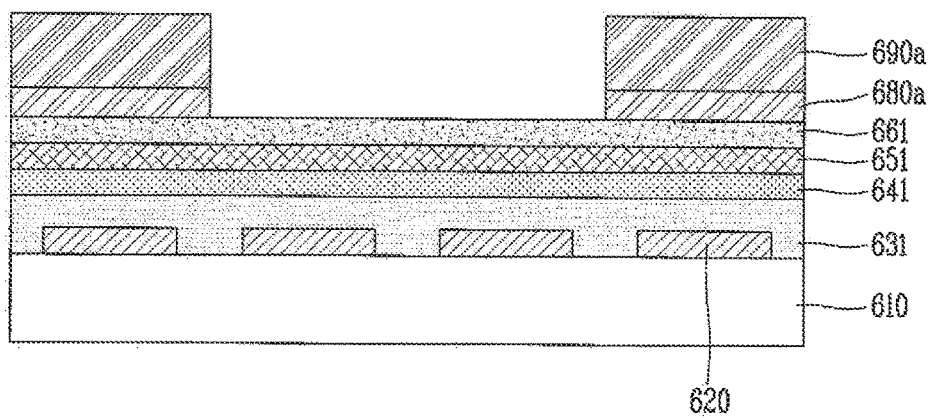

Thereafter, as shown in FIG. 11E, when a partial region of first conductive film formed under the first photosensitive resin pattern 690a is selectively etched by using the first photosensitive resin pattern 690a as a mask, a first common electrode 680a formed of the first conductive film is formed at a position where the first light emitting layer is to be formed.

Here, the etching may include wet etching as well as dry etching.

Figure 11F:
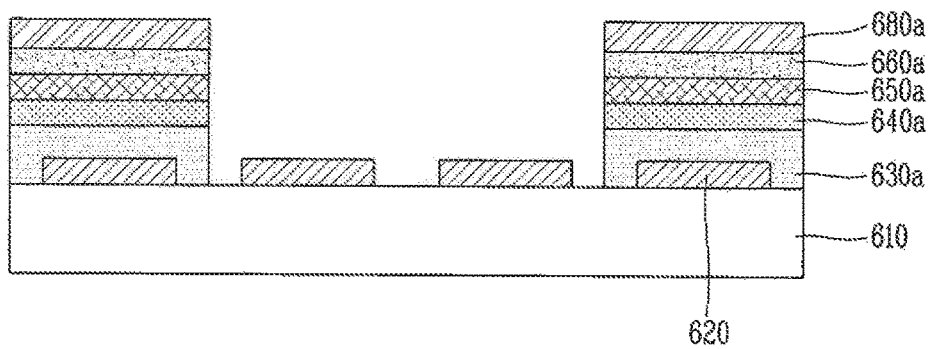

Thereafter, as shown in FIG. 11F, a remnant of the first photosensitive resin pattern is removed through ashing, stripping, or the like, and here, as partial regions of the thin film for a first hole injection layer, the thin film for a first hole transport layer, the first organic film, and the thin film for a first electron transport layer exposed thereunder are selectively removed by using the first common electrode 680a as a mask, a first hole injection layer 630a, a first hole transport layer 640a, a first light emitting layer 650a, and a first electron transport layer 660a, which are formed of the thin film for a first hole injection layer, the thin film for a first hole transport layer, the first organic film, and the thin film for a first electron transport layer, respectively, are formed (a first photo process).

In this manner, since the first common electrode 680a is positioned as a barrier layer on an upper portion of the organic compound layer, namely, on the first electron transport layer 660a, the organic compound layer, in particular, the first electron transport layer 660a, can be prevented from being degraded during the photo process, thus preventing a degradation of the device.

Here, the first light emitting layer 650a may be a red light emitting layer, but the present invention is not limited thereto and the first light emitting layer 650a may be a green or blue light emitting layer.

Figure 11G:
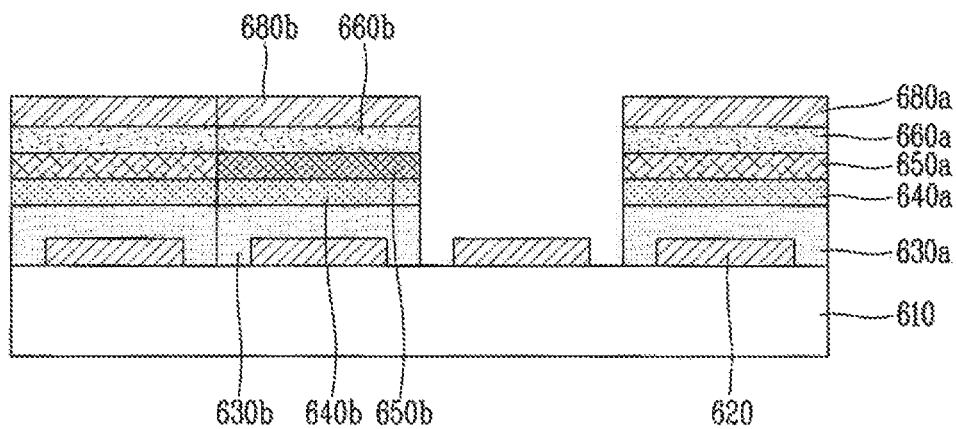

Next, as shown in FIG. 11G, a second hole injection layer 630b, a second hole transport layer 640b, a second light emitting layer 650b, a second electron transport layer 660b, and a second common electrode 680b, which are formed of a thin film for a second hole injection layer, a thin film for a second hole transport layer, a second organic film, a thin film for a second electron transport layer, and a second conductive film, respectively, are formed on the substrate 610 through a second photo process which is substantially the same as the first photo process as mentioned above.

Here, the second conductive film may be made of a reflective conductive material including calcium (Ca), barium (Ba), magnesium (Mg), aluminum (Al), silver (Ag), or the like, or a transparent conductive material such as ITO, IZO, or the like.

Here, for example, the second light emitting layer 650b may be a green light emitting layer. However, the present invention is not limited thereto and when the first light emitting layer 650a is a red light emitting layer, the second light emitting layer 650b may be a blue light emitting layer, other than a green light emitting layer.

Figure 11H:
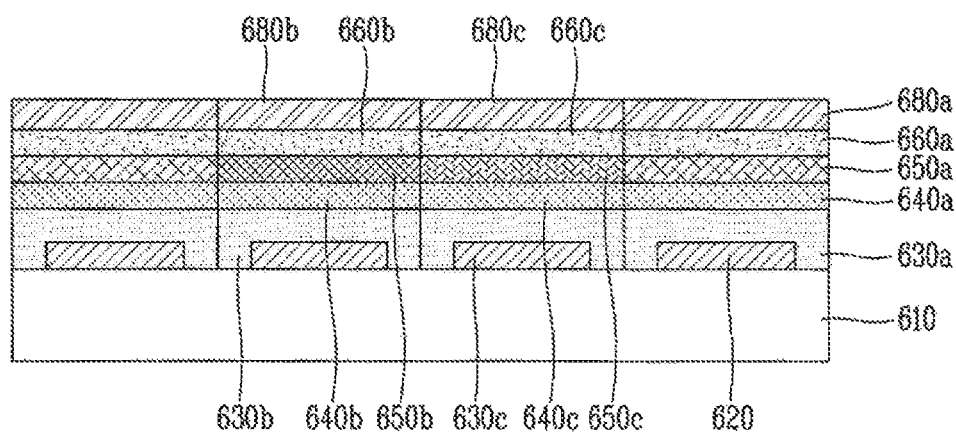

Thereafter, as shown in FIG. 11H, a third hole injection layer 630c, a third hole transport layer 640c, a third light emitting layer 650c, a third electron transport layer 660c, and a third common electrode 680c, which are formed of a thin film for a third hole injection layer, a thin film for a third hole transport layer, a third organic film, a thin film for a third electron transport layer, and a third conductive film, respectively, are formed on the substrate 610 through a third photo process which is substantially the same as the first and second photo processes as mentioned above.

Here, the third conductive film may be made of a reflective conductive material including calcium (Ca), barium (Ba), magnesium (Mg), aluminum (Al), silver (Ag), or the like, or a transparent conductive material such as ITO, IZO, or the like.

Here, for example, when the first light emitting layer 650a is a red light emitting layer and the second light emitting layer 650b is a green light emitting layer, the third light emitting layer 650c may be a blue light emitting layer. Also, when the first light emitting layer 650a is a red light emitting layer and the second light emitting layer 650b is a blue light emitting layer, the third light emitting layer 650c may be a green light emitting layer. However, the present invention is not limited thereto and the first light emitting layer 650a, the second light emitting layer 650b, and the third light emitting layer 650c may be configured as red, green, and blue light emitting layers irrespective of order.

In the OLED display device configured as described above, the first gate electrode connected to the gate line and the first source electrode and the first drain electrode connected to the data line may constitute a first switching thin film transistor (TFT) along with the first active layer. Also, the second gate electrode connected to the first drain electrode, the second source electrode connected to the driving voltage line, and the second drain electrode connected to the pixel electrode 620 may constitute a driving TFT along with the second active layer.

Also, the pixel electrode 620, the light emitting layers 650a, 650b, and 650c, and the common electrodes 680a, 680b, and 680c may constitute an OLED, and the mutually overlapping storage electrode and driving voltage line may constitute a storage capacitor.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating an organic light emitting diode (OLED) display device, the method comprising:
    (a) forming a first electrode on a substrate;
    (b) applying a photosensitive resin to the entire surface of the substrate to form a first photosensitive resin layer;
    (c) selectively exposing and developing the first photosensitive resin layer to form a first photosensitive resin pattern made of the photosensitive resin at a position other than a position where a first light emitting layer is to be formed;
    (d) depositing a thin film for a first hole injection layer, a thin film for a first hole transport layer, a first organic film, a thin film for a first electron transport layer, and a thin film for a first buffer layer in a state in which the first photosensitive resin pattern remains;
    (e) removing the thin film for the first hole injection layer, the thin film for the first hole transport layer, the first organic film, the thin film for the first electron transport layer, and the thin film for the first buffer layer deposited on an upper portion of the first photosensitive resin pattern together with the first photosensitive resin pattern through a lift-off process to form the first hole injection layer, the first hole transport layer, the first light emitting layer, the first electron transport layer, and the first buffer layer, which are formed of the thin film for the first hole injection layer, the thin film for the first hole transport layer, the first organic film, the thin film for the first electron transport layer, and the thin film for the first buffer layer, respectively, on the substrate;
    (f) forming a second hole injection layer, a second hole transport layer, a second light emitting layer, a second electron transport layer, and a second buffer layer through the same processes as (b) to (e);
    (g) forming a third hole injection layer, a third hole transport layer, a third light emitting layer, a third electron transport layer, and a third buffer layer through the same processes as (b) to (e); and
    (h) forming a second electrode on the first, second, and third buffer layers,
    wherein the first, second, and third buffer layers are made of a metal oxide.

2. The method of claim 1, wherein the first, second, and third buffer layers are made of a 1-2 Group and 12-16 Group metal oxide or 3-12 Group transition metal oxide.

3. The method of claim 1, wherein the first light emitting layer is formed of any one of red, green, and blue light emitting layers.

4. The method of claim 3, wherein the second light emitting layer is formed of another one of the red, green, and blue light emitting layers.

5. The method of claim 4, wherein the third light emitting layer is formed of the other remaining one of the red, green, and blue light emitting layers.

6. The method of claim 1, wherein the second electrode includes first, second, and third patterns respectively formed on the first, second, and third buffer layers.

\* \* \* \* \*